US012306251B2

(12) United States Patent
Scholz et al.

(10) Patent No.: US 12,306,251 B2
(45) Date of Patent: May 20, 2025

(54) CONTACT-MONITORING DEVICE

(71) Applicant: Phoenix Contact GmbH & Co. KG, Blomberg (DE)

(72) Inventors: Peter Scholz, Brakel (DE); Marius Fischer, Paderborn (DE); Christian Reinhold, Hameln (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 276 days.

(21) Appl. No.: 17/775,598

(22) PCT Filed: Nov. 12, 2020

(86) PCT No.: PCT/EP2020/081847
§ 371 (c)(1),
(2) Date: Dec. 1, 2022

(87) PCT Pub. No.: WO2021/094418
PCT Pub. Date: May 20, 2021

(65) Prior Publication Data
US 2023/0296674 A1    Sep. 21, 2023

(30) Foreign Application Priority Data

Nov. 13, 2019 (DE) .................... 10 2019 130 646.9
Apr. 3, 2020 (BE) .................................. 2020/5218

(51) Int. Cl.
G01R 31/327    (2006.01)
(52) U.S. Cl.
CPC ................... *G01R 31/327* (2013.01)

(58) Field of Classification Search
CPC .............. G01R 31/327; G01R 31/3275; G01R 31/3271
(Continued)

(56) References Cited

U.S. PATENT DOCUMENTS 3,039,085 A * 6/1962 Keller ...................... G08B 1/08
340/517
4,864,285 A * 9/1989 Rodden .................. G01R 31/66
324/415

(Continued)

FOREIGN PATENT DOCUMENTS

CN    106291343 A * 1/2017 ........... G01R 31/327
CN    109156048 A * 1/2019 ........... G01R 31/327
(Continued)

*Primary Examiner* — Tung X Nguyen
*Assistant Examiner* — Robert P Alejnikov, Jr.
(74) *Attorney, Agent, or Firm* — LEYDIG, VOIT & MAYER, LTD.

(57) ABSTRACT

A contact monitoring device for monitoring an electrical contact having a first contact state and a second contact state includes: an oscillator circuit for generating an excitation signal; a coupler including a signal input and a signal output, the oscillator circuit being connected upstream of the signal input in order to apply the excitation signal to the coupler, the coupler converting the excitation signal into a contact monitoring signal and outputting the contact monitoring signal at the signal output in order to act on the electrical contact; and a detector for detecting a version of the excitation signal in order to monitor the electrical contact. A first impedance value is set with the electrical contact in the first contact state on the oscillator circuit, and a second impedance value is set with the electrical contact in the second contact state on the oscillator circuit.

22 Claims, 12 Drawing Sheets

(58) Field of Classification Search
USPC .......................................................... 324/415
See application file for complete search history.

(56) References Cited

U.S. PATENT DOCUMENTS

| | | | | |
|---|---|---|---|---|
| 2011/0291672 | A1* | 12/2011 | Huttinger | G01R 31/27 |
| | | | | 324/649 |
| 2015/0268303 | A1* | 9/2015 | Neic | G01R 31/3277 |
| | | | | 324/415 |
| 2019/0293471 | A1* | 9/2019 | Fehrenbach | G01F 23/266 |
| 2021/0223317 | A1 | 7/2021 | Scholz et al. | |

FOREIGN PATENT DOCUMENTS

| | | |
|---|---|---|
| DE | 102009006970 A1 | 12/2011 |
| DE | 102018114425 A1 | 12/2019 |
| JP | 2012211855 A * | 11/2012 |
| JP | 2014154487 A | 8/2014 |
| WO | WO 2018059649 A1 | 4/2018 |
| WO | WO 2019238403 A1 | 12/2019 |

* cited by examiner

CONTACT-MONITORING DEVICE

CROSS-REFERENCE TO PRIOR APPLICATIONS

This application is a U.S. National Phase application under 35 U.S.C. § 371 of International Application No. PCT/EP2020/081847, filed on Nov. 12, 2020, and claims benefit to German Patent Application No. DE 10 2019 130 646.9, filed on Nov. 13, 2019 and to Belgian Patent Application No. BE 2020/5218, filed on Apr. 3, 2020. The International Application was published in German on May 20, 2021 as WO 2021/094418 under PCT Article 21 (2).

FIELD

The present disclosure relates to a contact monitoring device for monitoring an electrical contact, in particular for monitoring a switching operation of a switching contact, a functional state of an overcurrent fuse and/or a functional state of an overvoltage fuse.

BACKGROUND

In electrical automation, actuators can be controlled by a switch, whereby it can be necessary to detect an actual connection of a switching contact of the switch. Such monitored feedback can be implemented, for example, by means of additional auxiliary contacts. Alternatively, a forced contact guide can be implemented to prevent faulty switching of the switch at increased production costs. For example, a faulty switching contact can have defective switching surfaces, in particular welded switching surfaces, or degraded semiconductor layers, so that switching off or on cannot be implemented contrary to an applied connection signal or contrary to a mechanical actuation.

The monitoring of switching contacts is particularly necessary for machine and system controls where, for example, switching relays are used, the switching contacts of which are switched frequently. Such contacts are subject to greater wear. Relays can be designed so that the switching contacts can withstand several hundred thousand switching operations, for example. With the contact monitoring device, it is possible to monitor the condition of the contact and to issue a message at the first sign of increased wear, indicating the state of wear. The operating personnel can then replace the contact, e.g. in the form of the relay, at an early stage.

Such contact monitoring devices are known in principle. They often work on the basis of a resonant circuit that is affected by the switching contact. In one switching state, a low attenuation is applied to the resonant circuit and in the other switching state, a higher attenuation. Thus, at least the amplitude of the oscillation changes, which can be measured e.g. via a voltage drop at a resistor.

The document DE 10 2018 114 425 A1 shows a concrete example of this type of contact monitoring device. There, the contact monitoring device is described using the example of monitoring a relay switching contact. A resonant circuit is supplied with an excitation signal from a signal generator via a transformer. However, resonant circuits can have temperature-dependent properties, which can lead to problems with the reliability of the measurement of the amplitude change.

A solution for a temperature-compensated resonant circuit is known from the document JP 2012 211 855 A. There, an FET transistor is used to set the resonance frequency of the resonant circuit, the operating point of which is temperature-compensated by using a thermistor in the voltage divider to set the operating point. The temperature-compensated oscillator is used in a RADAR sensor for a vehicle. The FET transistor of the oscillator is also used there as a frequency-determining element because it is the transistor capacitances that form the resonant circuit together with the coil. When the operating point is adjusted, the transistor capacitances change and thus the resonance frequency as well.

However, the known solutions for a contact monitoring circuit have the disadvantage that they cannot distinguish reliably enough between the proper function of the contact and a malfunction or require a complex structure for this and can therefore be complex and expensive. Additionally, there is a problem with temperature dependence in the existing contact monitoring devices. There is therefore a need for an improved contact monitoring device, in which the reliability of contact monitoring in particular is improved and which requires only a few and inexpensive components. This was recognised in the context of the invention.

SUMMARY

In an embodiment, the present invention provides a contact monitoring device for monitoring an electrical contact including a first contact state and a second contact state, comprising: an oscillator circuit configured to generate an excitation signal; a coupler including a signal input and a signal output, the oscillator circuit being connected upstream of the signal input in order to apply the excitation signal to the coupler, the coupler being configured to convert the excitation signal into a contact monitoring signal and to output the contact monitoring signal at the signal output in order to act on the electrical contact; and a detector configured to detect a version of the excitation signal in order to monitor the electrical contact, wherein a first impedance value is set with the electrical contact in the first contact state on the oscillator circuit, and a second impedance value is set with the electrical contact in the second contact state on the oscillator circuit, and wherein the oscillator circuit is configured to generate a resonance oscillation with the electrical contact in the first contact state and the first impedance value and to output the excitation signal.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
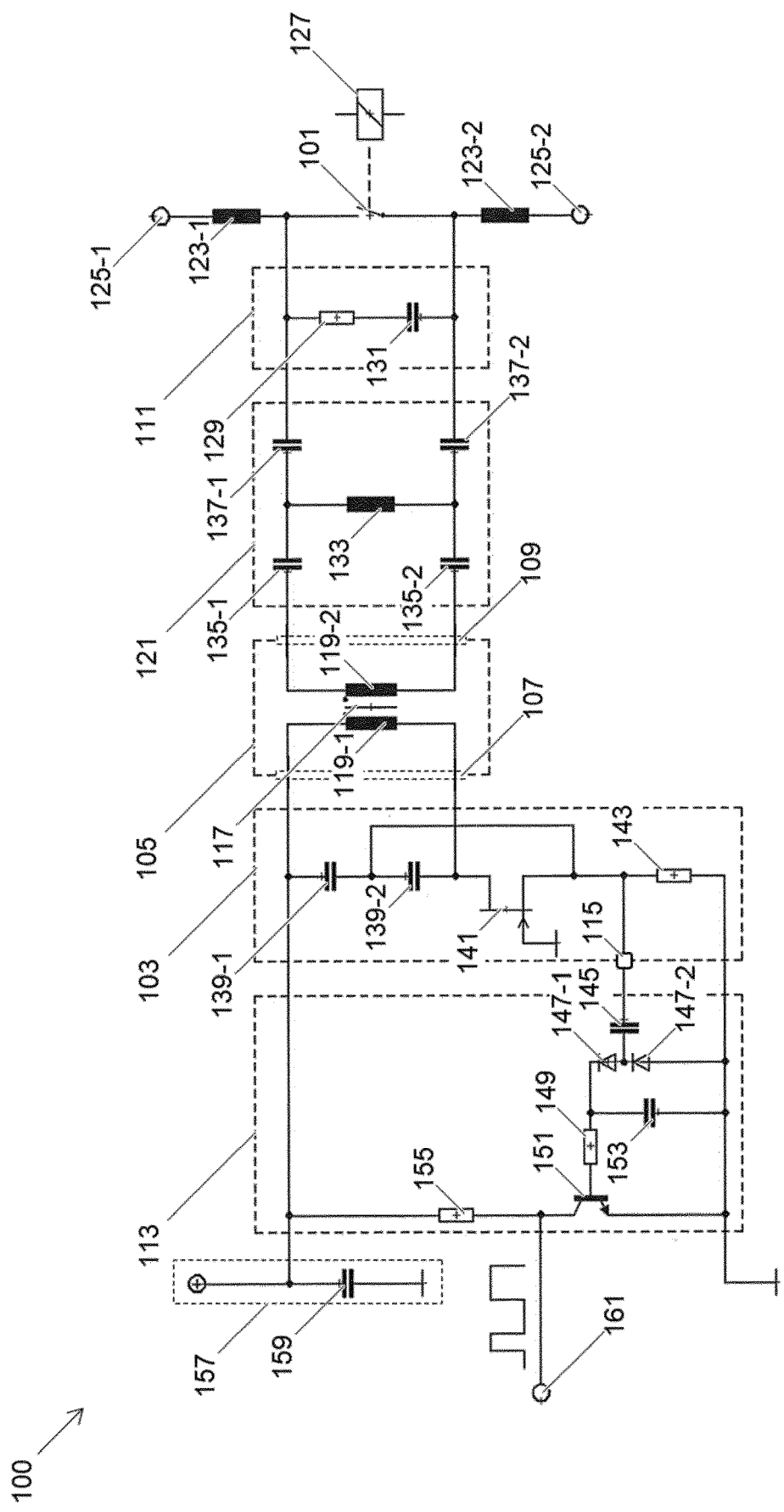
FIG. 1 shows the contact monitoring device in one embodiment.

In an embodiment, the present invention provides a contact monitoring device configured to generate a contact monitoring signal at the electrical contact by means of an oscillator circuit and, connected downstream of the oscillator circuit, a coupler and an attenuator, in particular when the electrical contact is in a closed contact state. In one embodiment, the oscillator circuit with the electrical contact is not capable of oscillating in an open contact state, so that the contact monitoring signal is not generated.

In another embodiment, the oscillator circuit is also capable of oscillating in the open contact state, but with a different resonance frequency. This can be achieved, for example, by switching in another capacitance in the resonant circuit when the contact is switched, so that a different total capacitance is active in the LC circuit. If the contact is defective, it no longer closes properly during the switching process and a resonance oscillation no longer occurs or the other resonance oscillation no longer occurs. This is detected and reported accordingly.

In a general embodiment, with the electrical contact in the first contact state on the oscillator circuit, a first attenuator is effectively switched, which causes a first impedance curve in the oscillator circuit, and with the electrical contact in the second contact state on the oscillator circuit, the first attenuator is ineffectively switched and/or a second attenuator is effectively switched, which causes a second impedance curve in the oscillator circuit, the oscillator circuit being configured to generate a resonance oscillation with the electrical contact in the first contact state and the first impedance curve and to output the excitation signal; and with the electrical contact in the second contact state and the second impedance curve, either not generating a resonance oscillation and outputting no excitation signal or generating another resonance oscillation and outputting another excitation signal; wherein the detector is configured to detect the one excitation signal and the other excitation signal or no excitation signal in order to monitor the electrical contact. The other resonance oscillation is generated when another frequency-determining element in the oscillator circuit is effectively switched by the change in contact state.

In an extended embodiment, a means for the thermal stabilisation of the oscillator circuit is provided in the oscillator circuit. In this case, the oscillator circuit has a resonant circuit with a feedback branch and an amplifier, whereby the amplifier amplifies the signal fed back via the feedback branch.

The solution then provides that the amplifier comprises at least one transistor for which the amplification can be set through its operating point, whereby the amplification of at least one transistor is stabilised by the means for thermal stabilisation. This is done in such a way that the operating point of the transistor is shifted, by changing the means for thermal stabilisation when the temperature changes. This automatically keeps the amplification of the transistor constant, even if the temperature changes.

In a preferred variant, a thermistor, in particular an NTC or PTC resistor, is used as an element in a voltage divider for the thermal stabilisation. The NTC resistor corresponds to an NTC thermistor and the PTC resistor to a PTC thermistor. Alternatively, a semiconductor diode can also be used as the NTC thermistor, which is switched in the reverse direction. By changing the resistance of the thermistor, the operating point of the transistor is shifted and thus the amplification factor is kept stable.

In another embodiment, a temperature sensor is used as means for the thermal stabilisation, the signal of which is evaluated by a microcontroller that generates a corresponding correction signal, which adjusts the operating point of at least one transistor for the thermal stabilisation.

In this case, the microcontroller can generate the correction signal in the form of a PWM signal, corresponding to a pulse-width modulated signal, and an averager can be used to output the average value of the PWM signal depending on the duty cycle. The operating point is set using the averaged correction signal.

In a low-cost variant, the averager is configured in the form of a low-pass filter consisting of a resistor and a capacitor.

This form of thermal stabilisation has the advantage that the temperature compensation can be carried out very precisely. However, the costs for this solution are higher.

The contact monitoring signal can be a high-frequency auxiliary energy in particular, which is generated by the oscillator circuit and coupled by the coupler into the load circuit with the electrical contact. A change in the impedance of the load circuit, in particular due to a switching of the electrical contact, is fed back to the oscillator circuit via the coupler and generates a signal change between the oscillator circuit and the coupler, which can be used to detect a switching of the electrical contact.

According to a first aspect, the disclosure relates to a contact monitoring device for monitoring an electrical contact comprising a first contact state and a second contact state. In particular, the electrical contact can be a switching contact which is closed in the first contact state and open in the second contact state. For example, the electrical contact can be low-impedance in the first contact state and high-impedance in the second contact state.

The contact monitoring device comprises an oscillator circuit configured to generate an excitation signal, and a coupler that has a signal input and a signal output. The oscillator circuit is connected upstream of the signal input in order to apply the excitation signal to the coupler, and the coupler is configured to convert the excitation signal into a contact monitoring signal and to output the contact monitoring signal at the signal output for acting on the electrical contact.

With the electrical contact in the first contact state, a first impedance value is set on the oscillator circuit, and with the electrical contact in the second contact state, a second impedance value is set on the oscillator circuit.

The oscillator circuit is configured to generate a resonance oscillation with the electrical contact in the first contact state and with the first impedance value, and to output a version of the excitation signal, for example an excitation signal which is altered in amplitude, in particular attenuated.

In one embodiment, with the electrical contact in the second contact state and with the second impedance value, the excitation signal is prevented from being output.

Further, the contact monitoring device comprises a detector configured to detect a version of the excitation signal and/or a change of the excitation signal to monitor the electrical contact.

The first impedance value can in particular be greater than the second impedance value. Furthermore, an attenuator can be provided to set the first impedance value and/or the second impedance value, in particular depending on the respective contact state of the electrical contact, at the signal input.

The electrical contact can be electrically conductive in the first contact state and electrically non-conductive in the second contact state. In particular, the contact monitoring device can be configured to not continuously actuate the contact monitoring signal to the electrical contact in order to prevent a permanent coupling, in particular of a high-frequency contact monitoring signal via the electrical contact into a load circuit, which in particular conducts low-frequency signals. The advantage of improved EMC properties of the contact monitoring device can be achieved accordingly.

The electrical contact can be a power switching contact of an electromechanical relay, of a solid state relay, of a contactor, of a reed contact or of a mechanical switch. The electrical contact can in particular be configured to have a first ohmic resistance in a first, in particular closed, contact state and to have a second ohmic resistance in a second, in particular open, contact state, the first ohmic resistance being lower than the second ohmic resistance. In particular, the electrical contact is low-impedance in the closed contact state and high-impedance in the open contact state.

The electrical contact can be a fuse, in particular a safety fuse, which is electrically conductive or low-resistance in a first contact state and electrically non-conductive or high-resistance, respectively, in a second contact state in which the fuse has blown.

Furthermore, the first contact state can be a first switching state of the electrical contact, in particular of an electrical switching element, and the second contact state can be a second switching state of the electrical contact, in particular of the electrical switching element.

In one embodiment, the contact monitoring device is configured to apply the contact monitoring signal as a differential signal to the electrical contact, wherein the differential signal is a current signal that causes a small voltage drop at a small contact resistance, in particular the electrical contact in the first contact state. This has the particular advantage that the contact monitoring signal in the electrical contact has a low amplitude and accordingly, only low high-frequency signal components are superimposed on a useful signal flowing via the electrical contact. Accordingly, the EMC properties of the contact monitoring device can be improved.

In one embodiment, the oscillator circuit is configured to generate the excitation signal in the high-frequency range, preferably with a frequency in a range from 1 MHz to 100 MHz, more preferably with a frequency of 50 MHz. This has the particular advantage that a frequency separation of the contact monitoring signal and of the useful signal can be implemented with inexpensive frequency filter elements. The oscillator circuit can be a high-frequency generator connected to the electrical contact, in particular via the coupler and the attenuator, for example in parallel.

In one embodiment, the oscillator circuit comprises a self-oscillating oscillator which, in particular, has a variable resonance frequency and is configured to generate an electromagnetic oscillation with the electrical contact in a first contact state, in particular a low-impedance, closed contact state.

In one embodiment, the attenuator is configured to set the first impedance value at the signal input with the second contact state. Accordingly, the oscillator circuit can be configured to generate the excitation signal with the open electrical contact, or to not generate the excitation signal with the closed electrical contact, respectively.

By monitoring the electrical contact of a relay with the contact monitoring device, switching information regarding the transition of the electrical contact between a first contact state in which the electrical contact is electrically non-conductive and a second contact state in which the electrical contact is electrically conductive, can be generated when the switch-on signal is applied to the electrical contact. This ensures that the relay switches with the switch-on signal and that there is no fault in the electrical contact and/or a magnet system of the relay. Accordingly, if the switch-on signal is applied to the relay and there is no switching of the electrical contact, a malfunction of the relay can be detected. Furthermore, a deactivation of the relay when the switch-on signal drops out can also be monitored.

The contact monitoring device achieves the advantage that, under the aspect of functional safety, in particular according to the IEC 61508 standard, the contact state of the relay switching contact can be unambiguously detected. Accordingly, an increased level of diagnostic coverage can be improved.

The detector can in particular be configured to convert a change in the excitation signal or a change in the contact monitoring signal, respectively, into an output signal, which can be a discrete-time and/or discrete-amplitude signal, in particular a binary signal and/or a digital signal. A first output signal amplitude can be associated with the first contact state, respectively a closed electrical contact, and a second output signal amplitude can be associated with the second contact state, respectively an open electrical contact. The detector can be configured to adapt the output signal or its version instantaneously or with as small a time delay as possible to a change in the excitation signal and/or the contact monitoring signal. A change in the excitation signal can in particular be a change between generating the excitation signal based on a fulfilled resonance condition of the oscillator circuit and not generating the excitation signal based on an unfulfilled resonance condition of the oscillator circuit.

In one embodiment, in the second contact state, the formation of the resonance oscillation is prevented, thereby preventing the output of the excitation signal.

In one embodiment, the oscillator circuit is configured to use the first impedance value to generate the excitation signal with an excitation frequency corresponding to a resonance frequency of the oscillator circuit, wherein the oscillator circuit is further configured to change a signal amplitude of the excitation signal based on an impedance value at the signal input. The oscillator circuit can be configured to change from a non-oscillatory to an oscillatory state with a change in the impedance value at the signal input, whereby the signal amplitude of the excitation signal can also be changed continuously with a continuous change in the impedance value. The oscillator circuit is also configured to change from the non-oscillatory state to the oscillatory state when an impedance limit value is exceeded at the signal input.

In one embodiment, the contact monitoring device comprises an attenuator connected downstream of the signal output and coupled with the electrical contact, for example connected upstream or downstream, the attenuator being configured to provide an impedance with the electrical contact in the second contact state, in order to prevent an impedance of the electrical contact from being active in the second contact state, the signal input of the coupler being attenuated with the action of the attenuator, the oscillator circuit not being oscillatory and an output of the excitation signal being prevented.

In one embodiment, the coupler and the oscillator circuit are configured to form a resonant circuit, wherein the attenuator is configured to attenuate the resonant circuit in the second contact state to reduce a signal amplitude of the excitation signal.

In one embodiment, the attenuator is coupled with the electrical contact, for example electrically connected in parallel, with the electrical contact in the first contact state bridging the attenuator at low resistance and reducing an attenuation of the attenuator coupled with the signal input by means of the coupler. The oscillator circuit is configured to generate the excitation signal with an increased signal amplitude when the attenuation is reduced.

In one embodiment, the oscillator circuit has a detector output and is configured to provide the excitation signal or a version of the excitation signal, respectively, to the detector via the detector output.

In one embodiment, the detector is configured to convert the excitation signal into an output signal and to output the output signal in at least two different signal states, wherein a first signal state of the at least two signal states indicates a closed electrical contact and a second signal state of the at least two signal states indicates an open electrical contact.

In one embodiment, the detector is configured to output the output signal in the first signal state when an oscillating excitation signal is applied to the detector output, and to output the output signal in the second signal state when a non-oscillating excitation signal is applied to the detector output, a signal amplitude of the excitation signal is below an amplitude limit value and/or the excitation signal is not applied to the detector output.

In one embodiment, the coupler is configured to galvanically isolate the oscillator circuit and/or the detector from the electrical contact.

In one embodiment, the coupler is configured as a direct galvanic connection, for example a cable connection, of the contact to the oscillator circuit, so that a change in the electrical contact can act directly on the impedance of the oscillator circuit.

In one embodiment, the detector is configured to detect a switch-on signal for switching the electrical contact and a change in the excitation signal and to output a binary error signal indicating whether the electrical contact is switched in accordance with the switch-on signal. This has the advantage that the detector can detect whether both the switch-on signal and the excitation signal carry identical logical information about the contact state of the electrical contact. The switch-on signal can be provided to the detector via a switching control connection in particular.

The detector can also be configured to detect a first logical information when the excitation signal or a resonance oscillation is applied to the detector input, respectively, and to detect a second logical information, the excitation signal with the switch-on signal, when the switch-on signal is applied to the switching control terminal. Furthermore, the detector can be configured to compare the first logical information with the second logical information.

The detector can be configured to generate an output signal based on the comparison of the first logical information with the second logical information, the output signal indicating a match or a divergence of the first logical information with respect to the second logical information. The first logical information can in particular be binary switching information relating to the electrical contact, which is intended to trigger switching of the electrical contact, and the second logical information can in particular be binary test information describing the contact state of the electrical contact. In particular, the binary test information can provide information with respect to the electrical conductivity of the electrical contact.

Four different signal combinations can be created with the binary switching information and the binary test information (see Table 1).

TABLE 1

Possible combinations of switching information and test information

| Index | Switching information 0: Open contact 1: Close contact | Test information 0: electrical contact open 1: electrical contact closed | Condition/ Description |
|---|---|---|---|
| 1 | 0 | 0 | Proper operation, electrical contact open |
| 2 | 0 | 1 | Error condition, |
| 3 | 1 | 0 | Error condition |
| 4 | 1 | 1 | Proper operation, electrical contact closed |

According to the signal combinations, the detector can be configured to generate an output signal with a signal level representing a logic 0 in cases 1 and 4 and to generate an output signal with a signal level representing a logic 1 in cases 2 and 3. Alternatively, the different signal combinations could be assigned to corresponding amplitude values or output signal patterns of the output signal. An output signal pattern can, for example, be created by a unique sequence of signal pulses, in particular signal pulses with different pulse length.

In one embodiment, the detector is configured to detect the excitation signal within a predetermined time interval upon receiving the switch-on signal to determine whether the electrical contact is switched in accordance with the switch-on signal within the predetermined time interval.

In one embodiment, the contact monitoring device comprises an optical display element configured to indicate the detection of the switch-on signal and a corresponding detected switching of the electrical contact or a deviation from the expected switch-on signal, respectively.

In one embodiment, the coupler comprises a transformer having a first inductance and a second inductance, the first inductance being inductively coupled with the second inductance in order to convert the excitation signal into the contact monitoring signal.

In one embodiment, the coupler comprises a transformer comprising a first air coil and a second air coil which are inductively coupled with each other. The first air coil and the second air coil can be cylindrical coils or circular ring coils. Furthermore, a coil core, in particular a ferrite core or a magnetic core, can be arranged within the first air coil and/or within the second air coil in each case. In one embodiment, a magnetic core can be arranged partially in the first air coil and/or in the second air coil. The coil core can be made up of flux-carrying ferrite plates or ferrite sheets.

The transformer with the first inductance and the second inductance, which are each configured as air coils in particular, achieves the advantage, for example, that the coils can be produced by means of printed circuit board technology and a number of discrete electronic components can be reduced accordingly when producing the contact monitoring device. Furthermore, capacitive elements of the contact monitoring device can also be configured as printed circuit board capacitors to further reduce the number of discrete electronic components.

With the transformer inductances designed as planar coils, the advantage of cost-efficient production of the contact monitoring device in particular can be achieved, since this eliminates the need to intersperse the inductances with ferrite plates in particular. In particular, the transformer can be configured to achieve a coupling factor greater than 20% with respect to coupling the excitation signal via the first inductance with the second inductance in order to efficiently convert the excitation signal to the contact monitoring signal.

In one embodiment, the contact monitoring device comprises an impedance circuit connected downstream of the signal output and coupled, for example connected upstream, to the attenuator, the impedance circuit being configured to compensate for a leakage inductance and/or a leakage capacitance of the coupler in the case of a contact monitoring signal with a predetermined frequency.

In one embodiment, the impedance circuit is configured to minimise a total capacitance and/or a total inductance across the galvanic isolation of the coupler.

In one embodiment, the contact monitoring device comprises a first filter element and a second filter element, the electrical contact having a first output terminal downstream of which the first filter element is connected, and a second output terminal downstream of which the second filter element is connected, in order to attenuate high-frequency signals applied by means of the coupler to the electrical contact and/or to an electrical load and/or voltage source coupled with the electrical contact.

In particular, the filter elements achieve the advantage of functionally separating the contact monitoring device from an external circuitry of the electrical contact, which is connected, for example, to a first output terminal and a second output terminal. The first filter element and/or the second filter element can each comprise an inductance or ferrite configured to be low-impedance for low-frequency AC signals and high-impedance for high-frequency AC signals. This has the particular advantage that the filter elements can efficiently conduct low-frequency signals with high current.

The contact monitoring signal can have a frequency of preferably 100 kHz to 100 MHz. The filter elements have a high impedance for the contact monitoring signal in this frequency range, so that the contact monitoring signal is not present at the output terminals or is only present with reduced signal amplitude.

The filter elements also achieve the advantage that a low-resistance bridging of the electrical contact cannot be misinterpreted as an electrical contact in the first contact state by the contact monitoring device. In particular, the real part of an impedance value of the respective filter element can reach the order of magnitude of the attenuator's ohmic resistance value for a contact monitoring signal with a predetermined frequency. In this way, the particular advantage can be achieved that with the electrical contact in the second contact state and an external low-resistance bridging of the electrical contact, an attenuation value corresponding to the attenuation value provided by the attenuator can be achieved and an oscillation of the oscillator circuit can be prevented.

In one embodiment, the first filter element and/or the second filter element have a resistive impedance component at the oscillator frequency that is configured to prevent misinterpretation of an external short circuit of the first output terminal with the second output terminal as a closing of the electrical contact.

In one embodiment, the attenuator comprises a capacitance formed by a printed circuit board capacitor.

In one embodiment, the contact monitoring device comprises a supply voltage terminal to which a supply voltage can be applied, wherein the oscillator circuit and/or the detector can be supplied with electrical energy by means of the supply voltage terminal. Furthermore, the contact monitoring device can comprise a switching control terminal to which a switch-on signal can be applied in order to trigger the electrical contact.

In one embodiment, the detector and/or the oscillator circuit can be supplied with the switch-on signal via the switching control connection, the detector and/or the oscillator circuit being configured to be supplied with electrical energy by the switch-on signal. The connection signal can in particular be a DC voltage signal suitable for supplying the detector and/or the oscillator circuit with electrical energy. In one embodiment, the switch-on signal can be used to charge a buffer capacitor configured to supply the detector and/or the oscillator circuit with a constant voltage and/or a constant current for at least a predetermined time interval.

In one embodiment, a rectifier can be connected between the switching control terminal and the buffer capacitor, configured to convert an AC-type switch-on signal into a supply voltage for the detector and/or the oscillator circuit.

In one embodiment, the buffer capacitor is configured to continue to supply the detector and/or the oscillator circuit with electrical energy for a predetermined time interval when the switch-on signal ceases, in order to detect an opening of the electrical contact in accordance with the ceasing of the switch-on signal and to generate a corresponding output signal. In particular, the detector can be configured to output status information regarding a contact fault or proper switching of the electrical contact regarding the connection signal, respectively, before the power supply to the detector is interrupted with the output signal.

FIG. 1 shows a diagram of the contact monitoring device 100 for monitoring electrical contact 101 with at least two contact states according to one embodiment. The contact monitoring device 100 has an oscillator circuit 103 for generating an excitation signal and a coupler 105 with a signal input 107 and a signal output 109.

The oscillator circuit 103 is connected upstream of the signal input 107 in order to apply the excitation signal to the coupler 105, and the coupler 105 is configured to convert the excitation signal into a contact monitoring signal and to output the contact monitoring signal at the signal output 109 for acting on the electrical contact 101. Furthermore, the contact monitoring device 100 comprises an attenuator 111, which is connected downstream of the signal output 109 and connected upstream of the electrical contact 101.

With the electrical contact 101 in the first contact state, a first impedance value is set on the oscillator circuit 103, and with the electrical contact 101 in the second contact state, a second impedance value is set on the oscillator circuit 103.

The contact monitoring device comprises an attenuator 111 connected downstream of the signal output 109 and connected upstream of the electrical contact 101, the attenuator 111 being configured to provide an impedance with the electrical contact 101 in the second contact state, to prevent an impedance of the electrical contact 101 from being active in the second contact state, wherein the action of the attenuator 111 causes the signal input 107 of the coupling element 105 to be attenuated, the oscillator circuit 103 is not oscillatory, and an output of the excitation signal is prevented. The first impedance value is greater than the second impedance value.

The oscillator circuit 103 is configured to generate a resonance oscillation and output the excitation signal with the electrical contact 101 in the first contact state and the first impedance value, and to inhibit an output of the excitation signal with the electrical contact 101 in the second contact state and the second impedance value. Further, the contact monitoring device 100 comprises a detector 113 configured to detect the excitation signal in order to monitor a contact state change of the electrical contact 101.

The attenuator 111 comprises a resistor 129 which is configured to change or load, respectively, an impedance value at the signal input 107 in such a way that an oscillating circuit formed from the preferably inductive imaginary part of the coupler 105 and the preferably capacitive imaginary part of the oscillator circuit 103 experiences a high attenuation, under which the oscillator circuit 103 is not oscillatory and accordingly the contact monitoring signal is not applied to the electrical contact 101.

Furthermore, the attenuator 111 comprises a capacitance 131 which is configured to generate a high first impedance for a useful signal, in particular one of low frequency, applied to the electrical contact 101 via the output terminals 125-1, 125-2, in order to minimise or prevent leakage currents through the attenuator 111. Furthermore, the capacitance 131 is configured to generate a low second impedance for the contact monitoring signal in order to implement a spectral separation between the contact monitoring signal and the useful signal.

In particular, the capacitance 131 has a high dielectric strength, for example greater than or equal to 30 kV/mm, wherein the capacitance 131 is preferably designed as a printed circuit board capacitor. In particular, this has the advantage of reducing the number of discrete components required, so that a more cost-effective production is possible. Furthermore, the advantage of a reduced installation space for the contact monitoring device 100 can be achieved as a result.

In one embodiment, the printed circuit board capacitance 131 comprises conductor surfaces arranged on different layers of an at least two-layer circuit board. Thus, for example, the advantage can be achieved that by using the contact monitoring device 100 in safety-relevant areas, a malfunction of the contact monitoring device 100 based on a faulty capacitance 131 can be diminished or excluded. In particular, a malfunction based on a short circuit between different layers of a circuit board can be excluded in error analysis, so that the additional advantage can be achieved that the contact monitoring device 100 can be produced with reduced production costs.

When the electrical contact 101 closes, i.e. the electrical contact 101 changes from the second contact state to the first contact state, the attenuator 111 is bridged with low resistance due to the parallel connection of the attenuator 111 and the electrical contact 101, and accordingly is not active for a useful signal applied to the electrical contact 101, nor the contact monitoring signal. When the attenuator 111 is bridged, a transformed attenuation at the signal input 107 that can be generated by means of the resistor 129 of the attenuator 111 is reduced so that the resonant circuit has only low ohmic losses. Furthermore, the resonant circuit is to generate a resonance oscillation with the reduced attenuation.

The oscillator circuit 103 can be constructed as a Colpitts oscillator comprising the capacitors 139-1, 139-2 and a transistor 141. The transistor 141 is configured to amplify the excitation signal. Further, the oscillator circuit 103 comprises a resistor 143 via which the excitation signal can be fed to the detector 113. The inductance 119-1, which can be configured as a coil, can form an element of the oscillator circuit 103.

The detector 113 can comprise a capacitor 145 configured to separate a direct component of the excitation signal. Further, the detector 113 comprises at least two diodes 147-1, 147-2 and another capacitor 153, wherein the diodes 147-1, 147-2 and the capacitor 145 are designed to convert the excitation signal into a rectified output signal. Further, the detector 113 comprises a resistor 149 and a transistor 151, wherein the transistor 151 is interconnected via the resistor 149 when an oscillation generated by the oscillator circuit 103 is applied to the detector output 115 as an excitation signal. Furthermore, the detector 113 comprises a pull-up resistor 155, wherein the detector 113 is configured to provide the output signal via the pull-up resistor 155, wherein the output signal is in particular an inverted signal that outputs a logic 0 when the electrical contact 101 is closed, or in the first contact state, respectively, and outputs a logic 1 when the electrical contact 101 is opened, or in the second contact state, respectively.

In one embodiment, the detector 113 comprises an output signal terminal 161 and is configured to invert the output signal to output a logic 1 at the output signal terminal 161 with the electrical contact 101 in the first contact state, and to output a logic 0 at the output signal terminal 161 with the electrical contact 101 in the second contact state.

Furthermore, the contact monitoring device 100 comprises a supply voltage terminal 157 to which a supply voltage can be applied, wherein the oscillator circuit 103 and/or the detector 113 can be supplied with electrical energy by means of the supply voltage terminal 157. The supply voltage terminal 157 can comprise a smoothing capacitor 159 configured to smooth a supply voltage. Further, the smoothing capacitor 159 can be configured as a buffer capacitor configured to provide electrical power to the oscillator circuit 103 and/or the detector 113 for a predetermined time interval, in particular even when an external power supply is interrupted via the supply voltage terminal 157.

The coupler 105 comprises a transformer 117 configured to inductively couple the oscillator circuit 103 with the impedance circuit 121 and the attenuator 111.

The impedance circuit 121 comprises the capacitances 135-1, 135-2 which are configured to compensate for a leakage inductance, in particular a leakage inductance of the transformer 117 at a predetermined frequency of the excitation signal generated by the oscillator circuit 103. In particular, the capacitances 135-1, 135-2 achieve the advantage of minimising a total capacitance of the galvanic isolation by means of the coupler 105 and/or the advantage of a symmetrical structure. The capacitances 135-1, 135-2 can in particular be formed by capacitors that have the same capacitance values.

Further, the impedance circuit 121 comprises the capacitors 137-1, 137-2 and the inductance 133. In one embodiment, only one of the capacitors 137-1, 137-2 and/or only one of the capacitors 135-1, 135-2 can be provided.

The inductance 133 and the capacitances 137-1, 137-2 together form an LC element configured to respond to electrical signals corresponding to an electric line with invertible impedance. An inductance value of the inductance 133 and a capacitance value of the capacitances 137-1, 137-2 can be selected such that when the electrical contact 101 is in the first contact state, the LC element has a high impedance value in order to switch the signal output 109 of the coupler 105 to high-impedance and accordingly unloaded. As a result, an impedance value at the signal input 107 can have a high real part, which can prevent the oscillator circuit 103 from generating the excitation signal.

Figure 2:
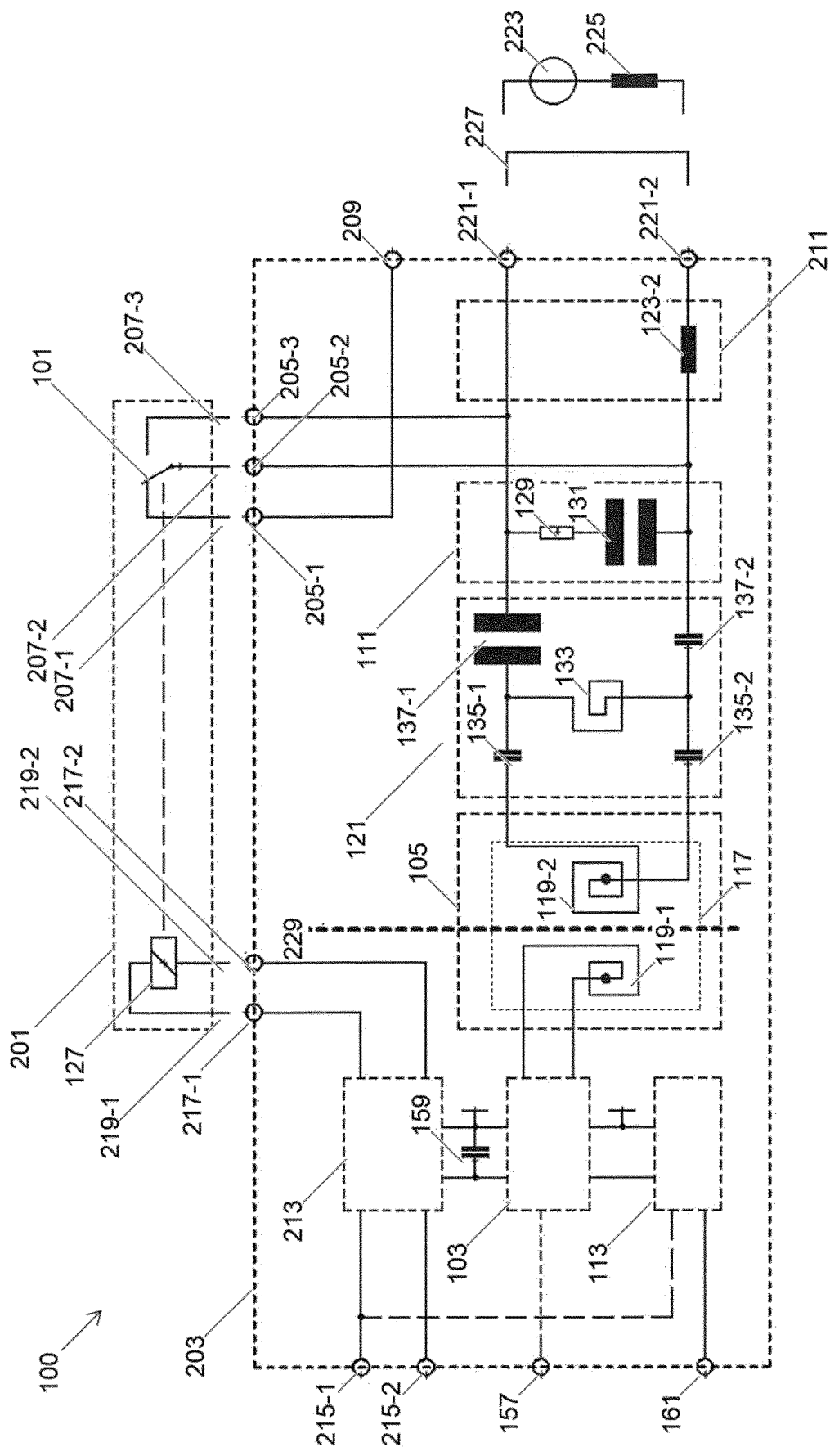
FIG. 2 shows the contact monitoring device in one embodiment.

FIG. 2 shows a diagram of the contact monitoring device 100 for monitoring an electrical contact 101 with at least two contact states according to one embodiment. The contact monitoring device 100 is integrated into a module base 203, wherein the electrical contact 101 is part of a switching module 201. The module base 203 comprises three switching contact terminals 205-1, 205-2, 205-3, which are designed in particular as socket connectors. Furthermore, the switching module 201 comprises corresponding plug-in contacts 207-1, 207-2, 207-3, which can be inserted into the switching contact terminals 205-1, 205-2, 205-3 and can be electrically connected to them in order to connect the electrical contact 101 to the attenuator 111, in particular to connect it electrically in parallel with the attenuator 111.

The electrical contact 101 can in particular be a three-pole switch configured to electrically conductively connect the plug-in contacts 207-3 and 207-2 in a first contact state and to electrically conductively connect the plug-in contacts 207-1 and 207-2 in a second contact state. The contact monitoring device 100 is configured to detect an opening and a closing of the electrical connection between the plug-in contact 207-3 and the plug-in contact 207-2. The plug-in contact 207-1 can be routed to another contact monitoring device 100 via a pass-through terminal 209 in order to also monitor the electrical connection between the plug-in contacts 207-1 and 207-2. Further, the contact monitoring device 100 can be configured to apply an additional contact monitoring signal to the plug contacts 207-1 and 207-2 via the plug sockets 205-1 and 205-2 in order to monitor the electrical connection between the plug contacts 207-1 and 207-2.

The contact monitoring device 100 has a filter module 211 comprising the filter element 123-2. The filter element 123-2 can be formed by a single inductance, which in particular is configured as an RF ferrite. By eliminating the need for an additional filter element, the advantage of reduced production costs can be achieved with reliable operation of the contact monitoring device 100.

The capacitance 131 of the attenuator 111 can be formed as a printed circuit board capacitor in order to have an increased dielectric strength. Furthermore, at least one of the capacitances 137-1, 137-2, for example the capacitance 137-1 is formed as a high-voltage-proof PCB capacitor. The capacitances 137-1, 131 can each have a capacitance value preferably in the pF range. Even more preferably, the capacitances 137-1, 137-2 each have a capacitance value less than 100 pF. Furthermore, the further capacitors 135-1, 135-2 can also have a capacitance value in the pF range or each can have a capacitance value less than 100 pF. With low capacitance values, the particular advantage can be achieved that, for example, in AC applications, low, in particular negligible, leakage currents flow via the impedance circuit 121 and/or the attenuator 111.

The inductance 133 can be configured as a planar coil in the form of a spiral-shaped conductor track.

In one embodiment, the detector 113 can be configured to provide an output signal at the output signal terminal 161 only when a switch fault is present in the electrical contact 101. The detector 113 can be configured to detect a switch fault in the electrical contact 101 based on a logical deviation between the excitation signal and the switch-on signal used to trigger the electrical contact 101.

The switching module base 203 can further comprise a first switching control terminal 215-1 and/or a second switching control terminal 215-2, wherein the switch-on signal can be applied to the switching control terminals 215-1, 215-2 to trigger the electrical contact 101 in the switching module 201. The rectifier 213 is connected upstream of the first switching control terminal 215-1 and/or the second switching control terminal 215-2 and is configured to convert the switch-on signal into a rectified switch-on signal. Furthermore, the switching module base 203 comprises a first switching signal output 217-1 and/or a second switching signal output 217-2, wherein the rectifier 213 is configured to provide the rectified switch-on signal at the first switching signal output 217-1 and/or a second switching signal output 217-2.

The switching module 201 comprises a first switch connector 219-1 and/or a second switch connector 219-2. The first switch connector 219-1 is electrically connectable to the first switching signal output 217-1 when the switching module 201 is inserted into the switching module base 203 and/or the second switch connector 219-2 is electrically connectable to the second switching signal output 217-2 when the switching module 201 is inserted into the switching module base 203, in order to apply the switch-on signal to the switching element.

In one embodiment, the switch-on signal can be supplied to the detector 113, wherein the detector 113 is configured to evaluate the switch-on signal with respect to the excitation signal to detect a switching and/or a contact state of the electrical contact 101 as a function of the switch-on signal and to provide a corresponding output signal at the output signal terminal 161.

The capacitances 135-1, 135-2, 137-1, 137-2, 131, 139-1, 139-2, in particular the blocking capacitors, can each or as a subset be formed by conductor surfaces arranged on different layers of an at least two-layer circuit board. A plastic material of the circuit board can be arranged between the metallic conductor surfaces so that a capacitance is formed as a printed circuit board capacitor.

Furthermore, the contact monitoring device 100 comprises a supply voltage terminal 157 to which a supply voltage can be applied, wherein the oscillator circuit 103 and/or the detector 113 can be supplied with electrical energy by means of the supply voltage terminal 157. The supply voltage terminal 157 can in particular be formed by a supply terminal.

The contact monitoring device 100 further comprises a first load terminal 221-1 and a second load terminal 221-2, each of which is connected downstream of the filter module 211. The first load terminal 221-1 is electrically connected to the third switching contact terminal 205-3, and the second load terminal 221-2 is electrically connected to the second switching contact terminal 205-2. In particular, the first load terminal 221-1 is connectable to a load voltage supply 223 and is configured to apply a load voltage signal to the electrical contact 101 via the third switching contact terminal 205-3 and the third plug-in contact 207-3.

The second load terminal 221-2 is electrically connectable to an electrical load 225, with the electrical contact 101 in the first contact state applying the load voltage signal to the electrical load 225. Furthermore, the load terminals 221-1, 221-2 can be short-circuited with a line jumper 227. In this way, for example, a test case can be generated for the contact monitoring device 100 in order to check a reliable detection of the contact state of the electrical contact 101 even in the event of a low-impedance bridging of the electrical contact 101, in particular in the event of an external short circuit.

The coupler 105 comprises a transformer 117 configured to inductively couple the oscillator circuit 103 with the impedance circuit 121 and the attenuator 111. The transformer 117 has a first inductance 119-1, in particular a first planar coil, and a second inductance 119-2, in particular a second planar coil, wherein the first inductance 119-1 is inductively coupled with the second inductance 119-2 in order to convert the excitation signal into the contact monitoring signal. The transformer 117 is configured to galvanically isolate the oscillator circuit 103 from the impedance circuit 121, the attenuator 111 and/or the electrical contact 101. The galvanic isolation is indicated by the separating line 229.

Figure 3:
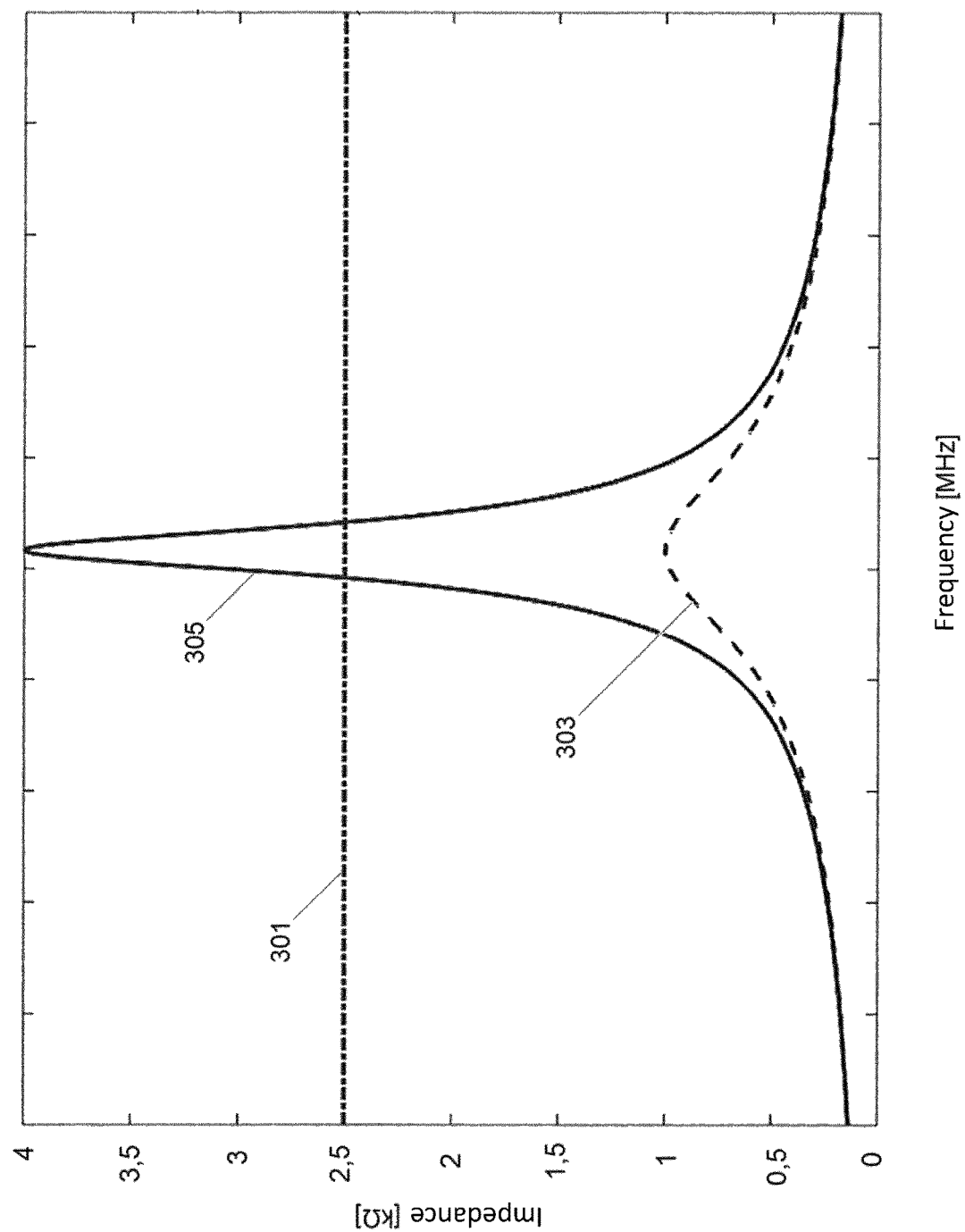
FIG. 3 shows the impedance at the signal input in one embodiment.

FIG. 3 shows the frequency-dependent impedance at the signal input in one embodiment. An inductance, which is formed in particular by the main inductance of the transformer of the coupler, acts on the signal input. For example, the inductance can have an inductance value of 200 nH. A capacitance, which is formed in particular by the capacitances of the oscillator circuit, also acts on the signal input. For example, the capacitance can have a capacitance value of 50 pF. Furthermore, an ohmic resistance, which is formed in particular by a signal output-side impedance transformed by means of the transformer, acts on the signal input. With the electrical contact in the first contact state, i.e. with a closed, electrically conductive electrical contact, a first resistance with a resistance value of, for example, 4 k$\Omega$ can act on the signal input. With the electrical contact in the second contact state, i.e. with an open, electrically insulating electrical contact, a second resistor with a resistance value of, for example, 1 k$\Omega$ can act on the signal input.

The resistance acting on the signal input can vary according to the contact state such that with a first resistance, the oscillator circuit is oscillatory and can generate the excitation signal with a resonance signal amplitude, and with the second resistance, the oscillator circuit is not oscillatory and cannot generate the excitation signal.

The oscillator circuit can be configured to transition from a non-oscillatory state to an oscillatory state with a resistance threshold 301 greater than 2.5 k$\Omega$. The contact monitoring device 111 is configured, by sizing the electrical components appropriately, to separate a first impedance curve 303 and a second impedance curve 305, by as large a difference in amplitude as possible. The amplitude difference can thereby scale with an impedance difference at the signal input based on the first contact state and the second contact state. With the first impedance curve 303, the oscillator circuit is in a non-oscillatory state and the excitation signal cannot be generated. With the second impedance curve 305, the oscillator circuit is in an oscillatory state and the excitation signal can be generated.

Figure 4:
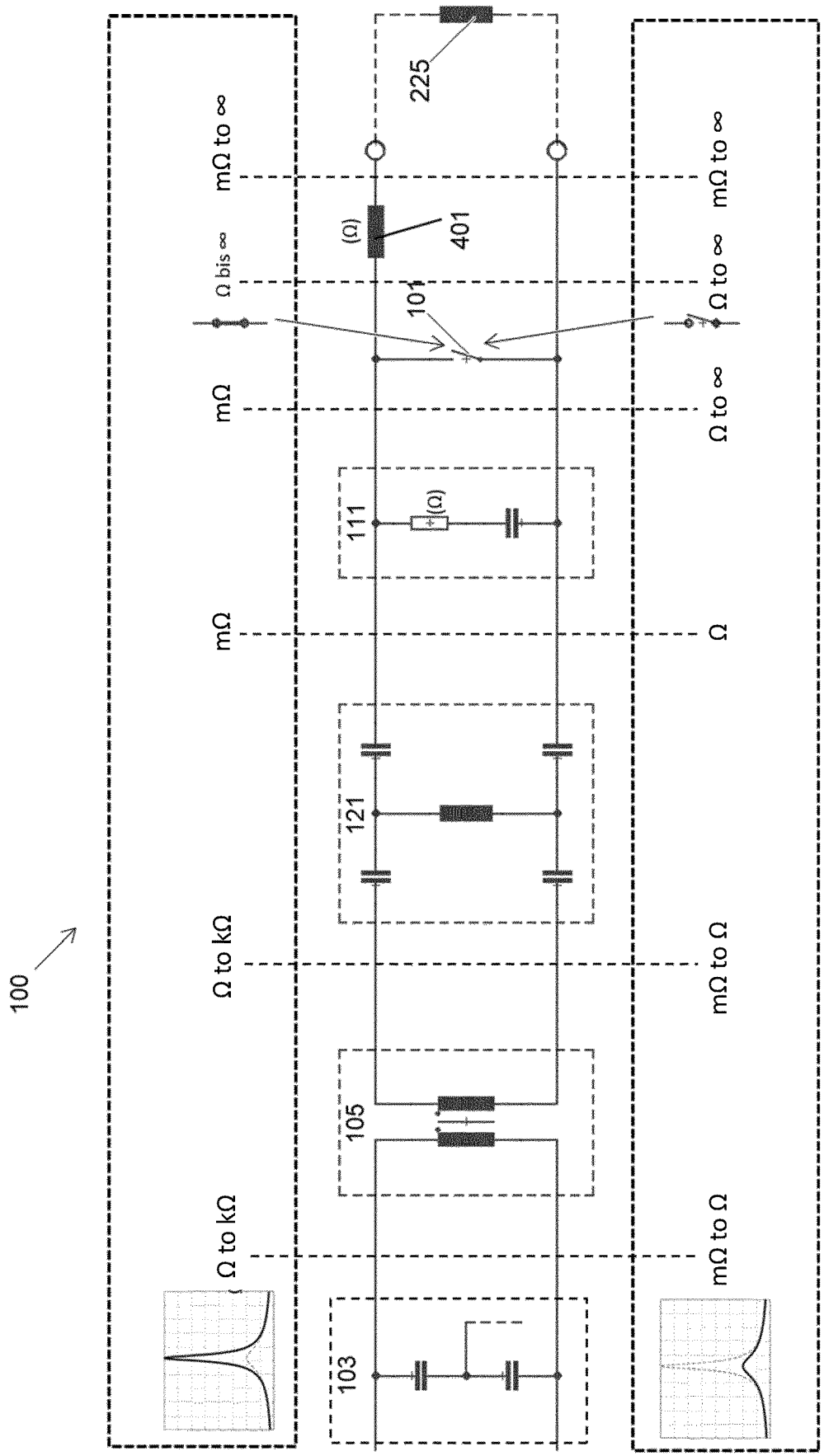
FIG. 4 shows the contact monitoring device in one embodiment.

FIG. 4 shows a diagram of the contact monitoring device 100 in one embodiment. Between the respective elements, the impedance to be expected in each case is indicated in ohms for the oscillator frequency to be expected. Above the diagram of the contact monitoring device 100, the impedance for the electrical contact 101 in the first contact state, or for the closed electrical contact 101, respectively, is indicated.

Furthermore, below the diagram of the contact monitoring device 100, the impedance for the electrical contact 101 in the second contact state, or for the opened electrical contact 101, respectively, is indicated. The load 225 can typically have an impedance in the range of m$\Omega$ to $\infty\Omega$.

A ferrite with an ohmic impedance component in the $\Omega$ range is connected downstream of the contact 101.

The attenuator 111 and/or the filter element are configured to already provide a defined impedance between the attenuator 111 and the impedance circuit 121 independently of an external circuitry of the contact monitoring device 100, in particular independently of an external load 225. This can achieve the advantage that when an electrical contact is open, the impedance value or an impedance range at this point is predetermined.

In particular, it can be prevented that an external or load-side short circuit, respectively, leads to an impedance at the oscillator circuit 103, even if the electrical contact 101 is open, which allows the generation of an oscillation and accordingly the generation of the excitation signal. Accordingly, it can be prevented that an external short circuit is misinterpreted as a closed electrical contact 101.

The impedance circuit 121 can be configured to transform a low impedance on the switching contact side to a high impedance on the coupler side with the closed electrical contact. Furthermore, the impedance circuit 121 can be configured to transform a high impedance on the switching contact side to a low impedance on the coupler side with the open electrical contact. The indicated impedance ranges correspond to the level of impedance at the respective point in the circuit related to a high frequency range.

Figure 5:
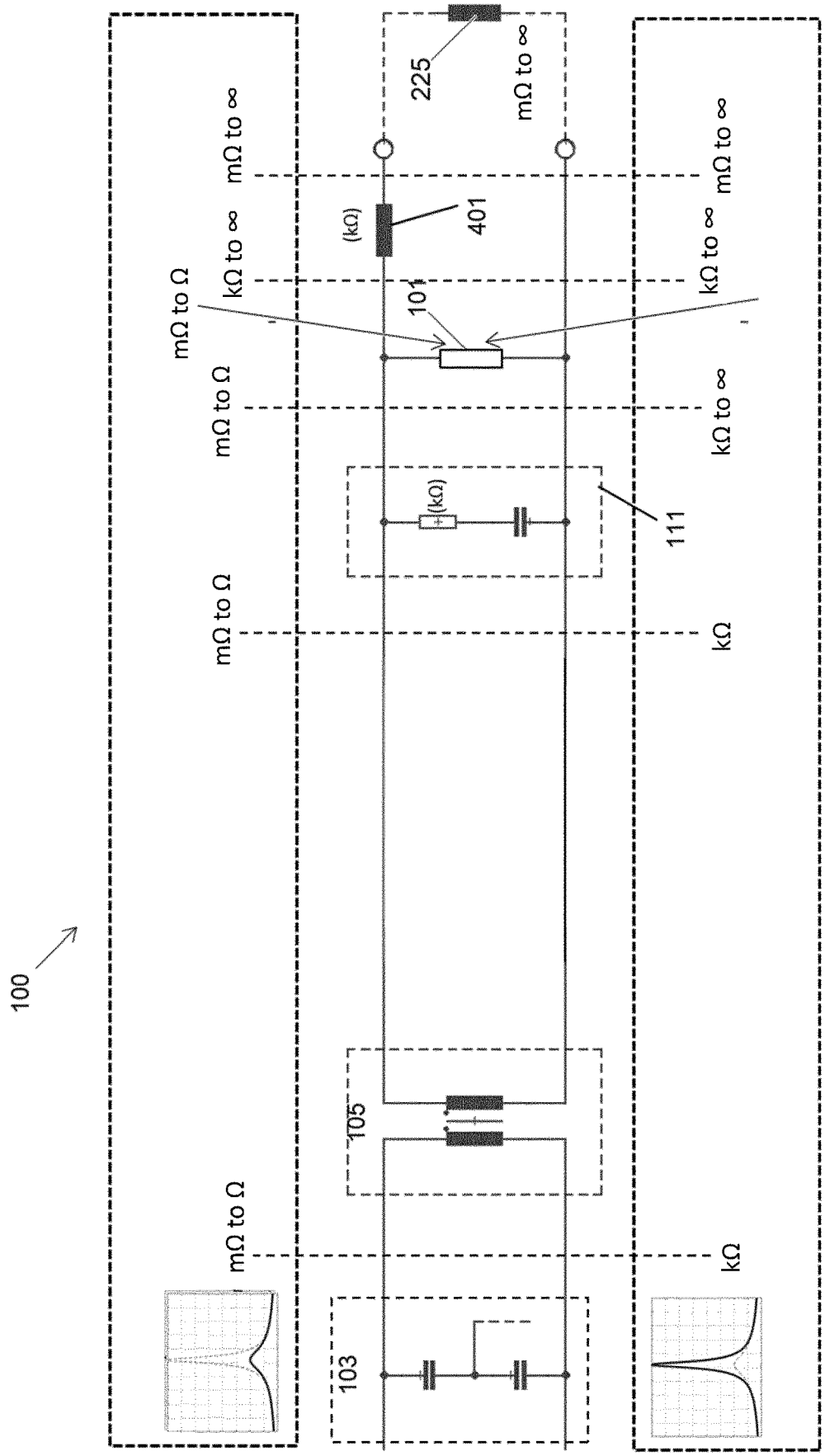
FIG. 5 shows the contact monitoring device in one embodiment.

FIG. 5 shows a diagram of the contact monitoring device 100 in one embodiment. The electrical contact 101 is an overcurrent and/or overvoltage fuse, in particular a safety fuse. The impedance to be expected in each case is indicated in ohms between the respective elements. Above the diagram of the contact monitoring device 100, the impedance for the electrical contact 101 in the first contact state, or for the unblown fuse, respectively, is indicated.

Furthermore, below the diagram of the contact monitoring device 100, the impedance for the electrical contact 101 in the second contact state, or for a blown fuse, respectively, is indicated. The load 225 can have an impedance in the range of m$\Omega$ to $\infty\Omega$.

If the electrical contact 101 is closed or conductive, the oscillator circuit 103 is not capable of oscillating. If the electrical contact 101 is open or the fuse has blown, respectively, the oscillator circuit is oscillatory. This makes it possible to monitor the condition of a (safety) fuse in particular. For example, the filter element can have an ohmic resistance in the kOhm range.

Figure 6:
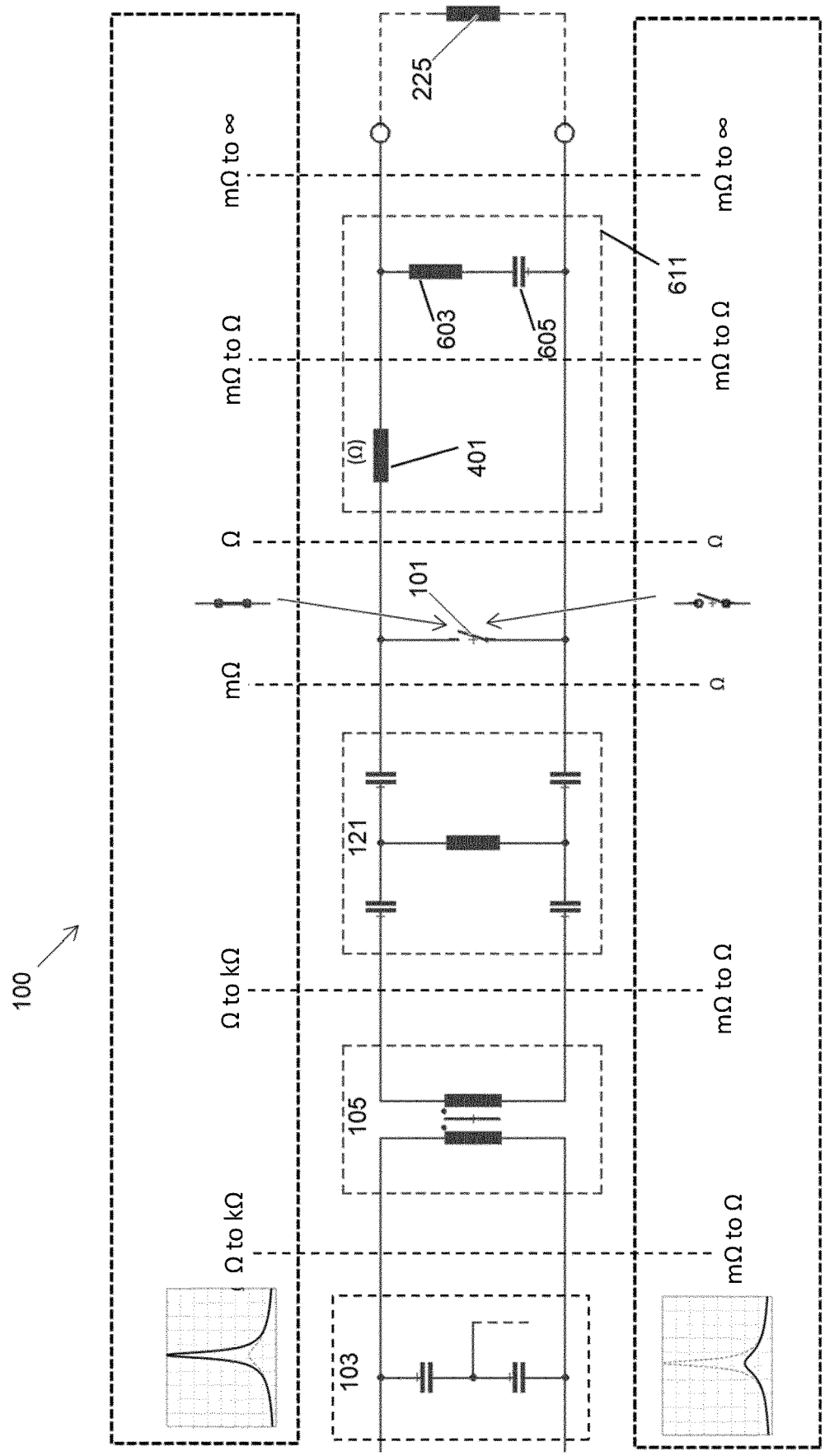
FIG. 6 shows the contact monitoring device in one embodiment.

FIG. 6 shows a diagram of the contact monitoring device 100 in one embodiment. In contrast to the embodiment shown in FIG. 5, for example, an attenuator 611 is provided which is connected downstream of the contact 101, which can be configured as a switch.

The attenuator 611 comprises a circuit with the ferrite 401, which causes a signal attenuation.

A series LC resonant circuit with an inductance 603 and a capacitance 605 is connected downstream of the ferrite bead 401. The series LC resonant circuit is provided to create a low impedance at the oscillation frequency, whereby the contact monitoring signal at the terminals can be minimised or reduced.

In one embodiment, the inductance 603 can also be omitted.

In one embodiment, the attenuator 611 can be integrated into the filter module 211.

The attenuator 611 corresponds in function to the attenuator 111. Furthermore, the attenuator 611 can have a filter characteristic due to the LC resonant circuit and therefore forms a filter in one embodiment.

Figure 7:
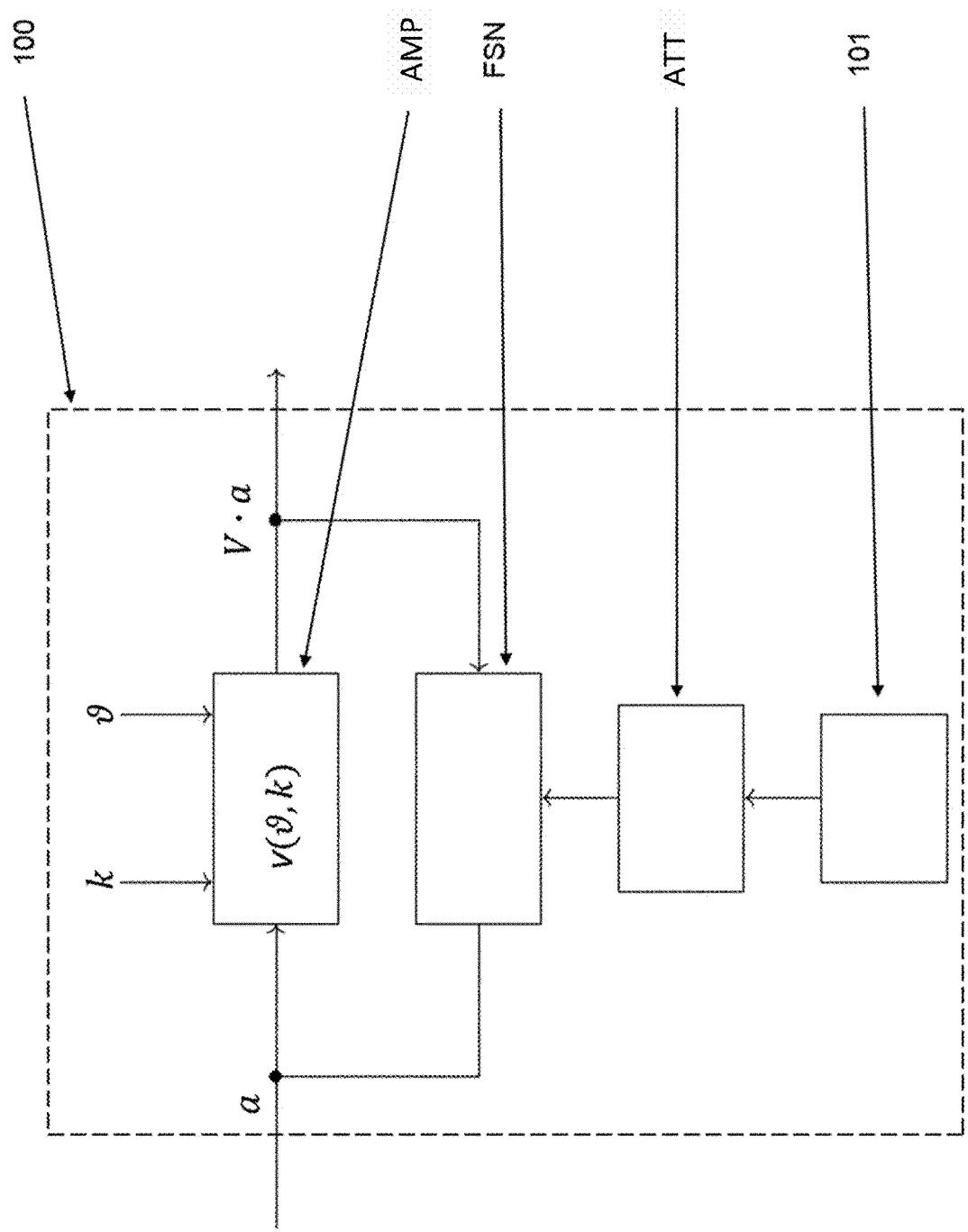
FIG. 7 shows a temperature-compensated contact monitoring device in general form.

In the following, exemplary embodiments for a temperature-compensated contact monitoring device are explained. FIG. 7 shows a basic block diagram of the contact monitoring device 100 with temperature compensation according to the invention. The contact monitoring device 100 includes an oscillator circuit comprising an amplifier AMP and a frequency-selective network FSN. An attenuator ATT acts on the frequency-selective network FSN. The effective attenuation is determined by the state of a contact 101 to be monitored. The amplifier AMP can have a gain dependent on the temperature and the operating point k of the amplifier. Typically, the temperature effect is such that a change in temperature changes the transistor currents, resulting in a change in amplification. This poses a problem, as will be explained in more detail below.

Figure 8:
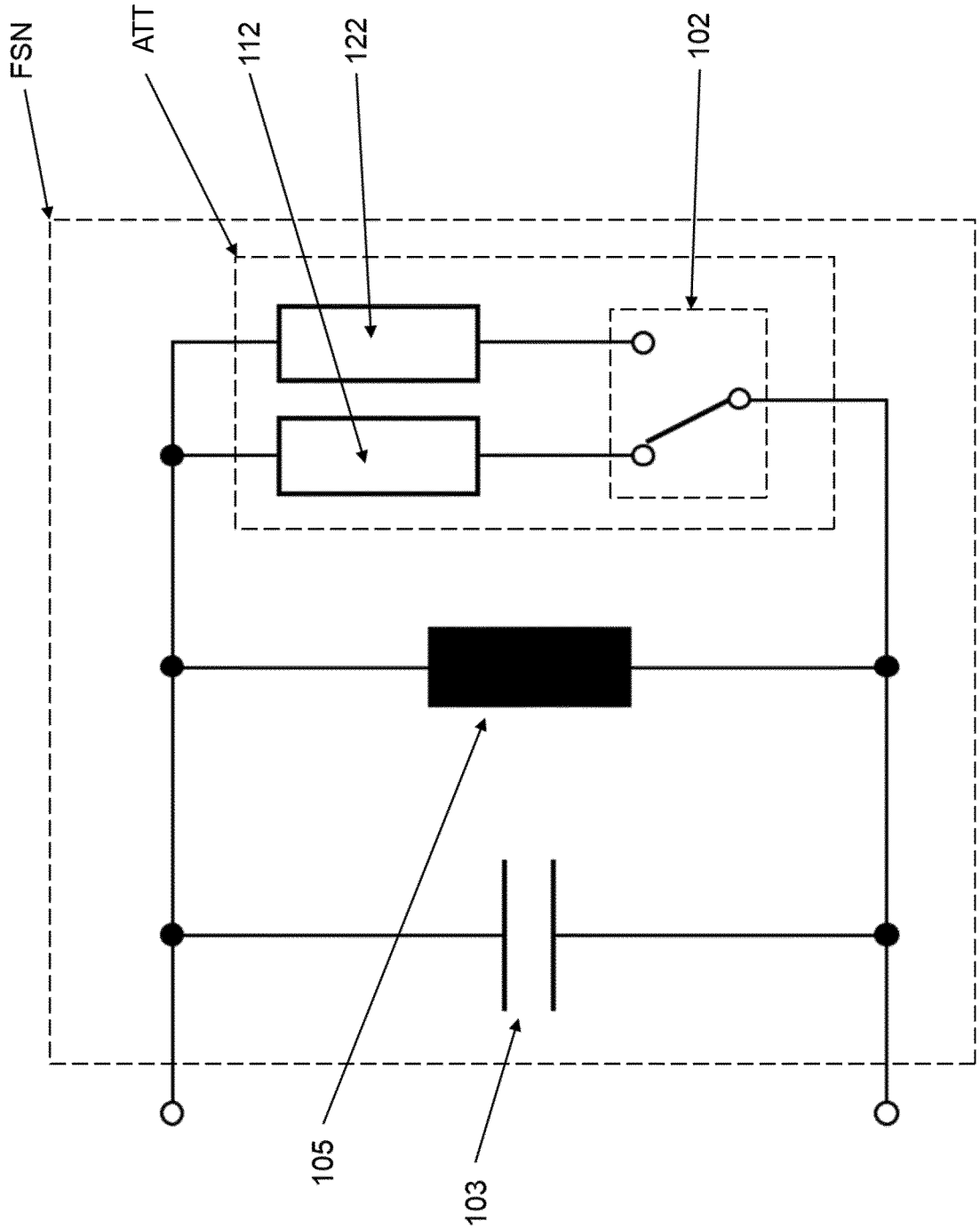
FIG. 8 shows a frequency-determining network of the contact monitoring device in general form.

First, the principle of the function of the contact monitoring device 100 is explained again, see FIG. 8. FIG. 8 shows a circuit diagram of the frequency-selective network FSN from FIG. 7. A state (e.g. contact closure yes/no) at the contact 101 to be monitored can affect the attenuation of the attenuator ATT of the frequency-selective network FSN. The attenuation of the frequency-selective network FSN is represented by the attenuators or effective resistors 112 and 122, which each have a different resistance value. The state of the contact 101 to be monitored affects the position of the switch 102 shown, which, depending on the switch position, connects one of the two attenuator resistors 112 and 122 to the rest of the frequency-selective network FSN. The frequency-selective network FSN is additionally formed by a parallel connection of an inductance 105 and a capacitance 103. The oscillator circuit can be designed for an operating point k in such a way that the amplification A of the amplifier AMP compensates for a low attenuation 112 for a first state and an oscillating input signal a can be observed at the input 114 or an oscillating output signal V*a at the output 115. At the same time, the oscillator circuit can be designed so that a higher attenuation 122 is active when the switching contact 102 assumes a second state. This then has the effect that there is no oscillating output signal V*a at the input 114 or at the output 115.

As is well known, a resonant circuit must fulfil the oscillation condition in order for a stable oscillation to occur. More clearly, the loop gain must be greater than or equal to 1 for stable oscillation.

The phase shift of the feedback loop must be an integer multiple of 360° at this frequency.

This is exactly what is exploited in the contact monitoring device. In the one switching state of the switching contact, the oscillation condition is fulfilled and in the other switching state of the switching contact, the resonant circuit is attenuated in such a way that stable oscillation does not occur (the amplification of the oscillator is not great enough to compensate for the losses due to attenuation).

Figure 9:
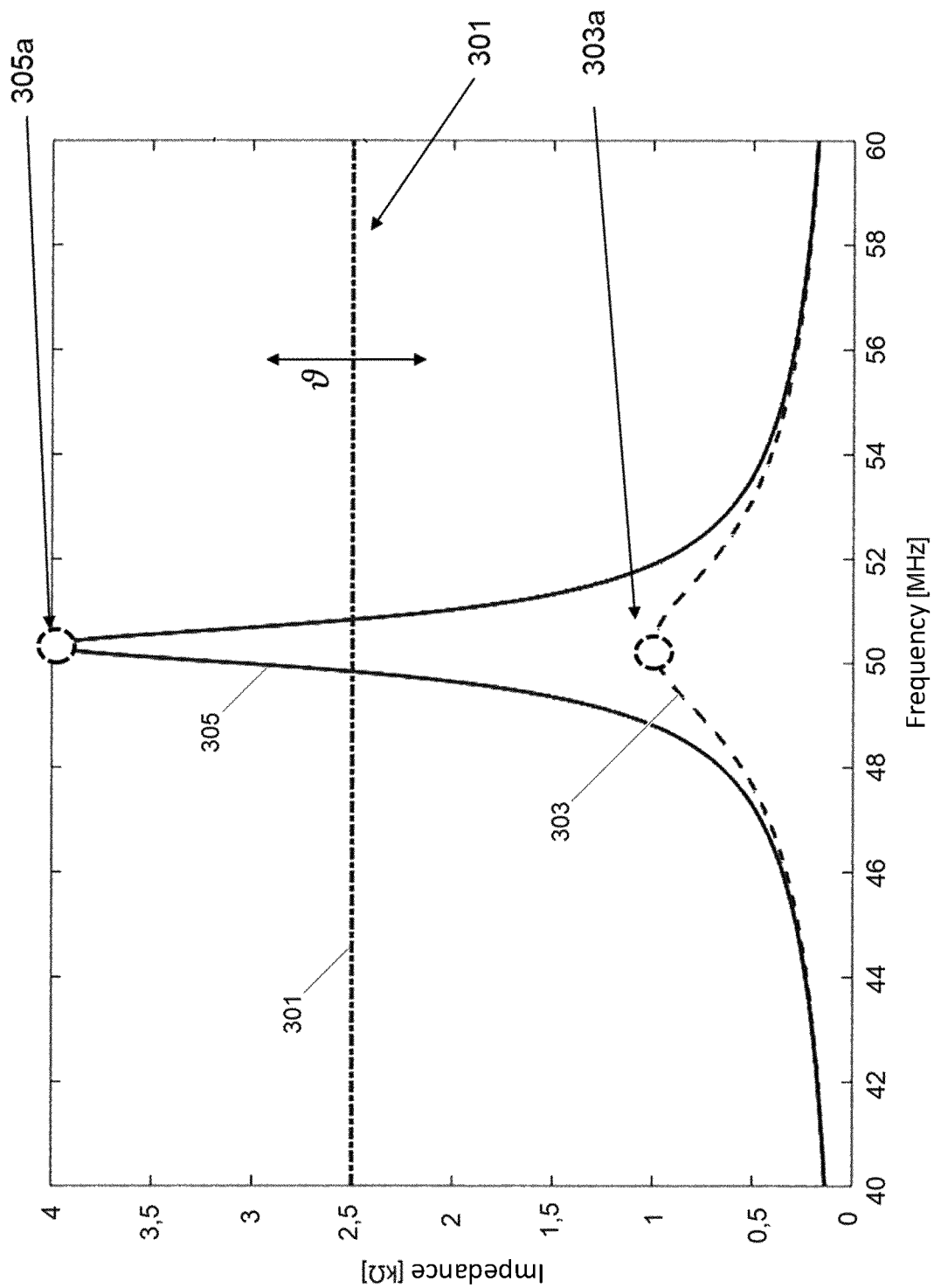
FIG. 9 shows two impedance curves of the frequency-determining network of the contact monitoring device.

This problem is now illustrated in conjunction with FIG. 9. FIG. 9 shows the impedance curve (frequency response) of a parallel resonant circuit. If the switching contact to be monitored is now switched to the low attenuation state, the oscillator of the contact monitoring device oscillates with the resonance frequency at approx. 50.2 MHz with the impedance curve as indicated in the impedance frequency response 305, see point 305a. If, on the other hand, the switching contact is switched to the high attenuation state, the oscillator of the contact monitoring device follows the impedance curve as indicated in the impedance frequency response 303, see point 303a. In this state with strong attenuation 303, there is no stable oscillation. The oscillation threshold 301 depends on the specific circuit as well as the amplifier element and should preferably lie in the middle between the two curves so that, depending on the contact state, the oscillator either definitely oscillates or definitely does not oscillate.

This desired behaviour of the oscillator circuit can be disturbed by a change in temperature. The amplifier AMP in particular shows a temperature-dependent behaviour. This is because the amplifier AMP's amplification factor is temperature-dependent. This is especially true for transistor amplifiers because the intrinsic conductivity of semiconductor materials changes with the temperature and thus the transistor currents. This can disturb the desired behaviour of the oscillator circuit and even cause malfunctions, where in one temperature range there are oscillating signals at output 115 for both effective attenuations 112 and 122, and/or in another temperature range there are no oscillating signals at output 115 for both effective attenuations 112 and 122, so that the contact monitoring device can no longer reliably distinguish between the states.

In a further development of the invention, the temperature dependence of the oscillator circuit is compensated by shifting the operating point of the amplifier AMP as a function of the temperature, i.e. k→k(ϑ), so that the amplification of the amplifier AMP has a negligible or no temperature dependence.

FIG. 9 shows the impedance frequency response of the frequency-selective network FSN from FIG. 8. Depending on whether the attenuator resistor 112 or 122 is effective, different impedance curves 303 or 305, respectively, result. The description of the impedance curves has already been explained in the context of the description of FIG. 3. At the resonance frequency at point 305a, resonance oscillation occurs in the case of impedance response 305, and the oscillating signal occurs at input 114 and at output 115. At the resonance frequency at point 303a, no resonance oscillation occurs in the case of impedance curve 303 and no oscillating signal occurs at input 114 and output 115.

Figure 10:
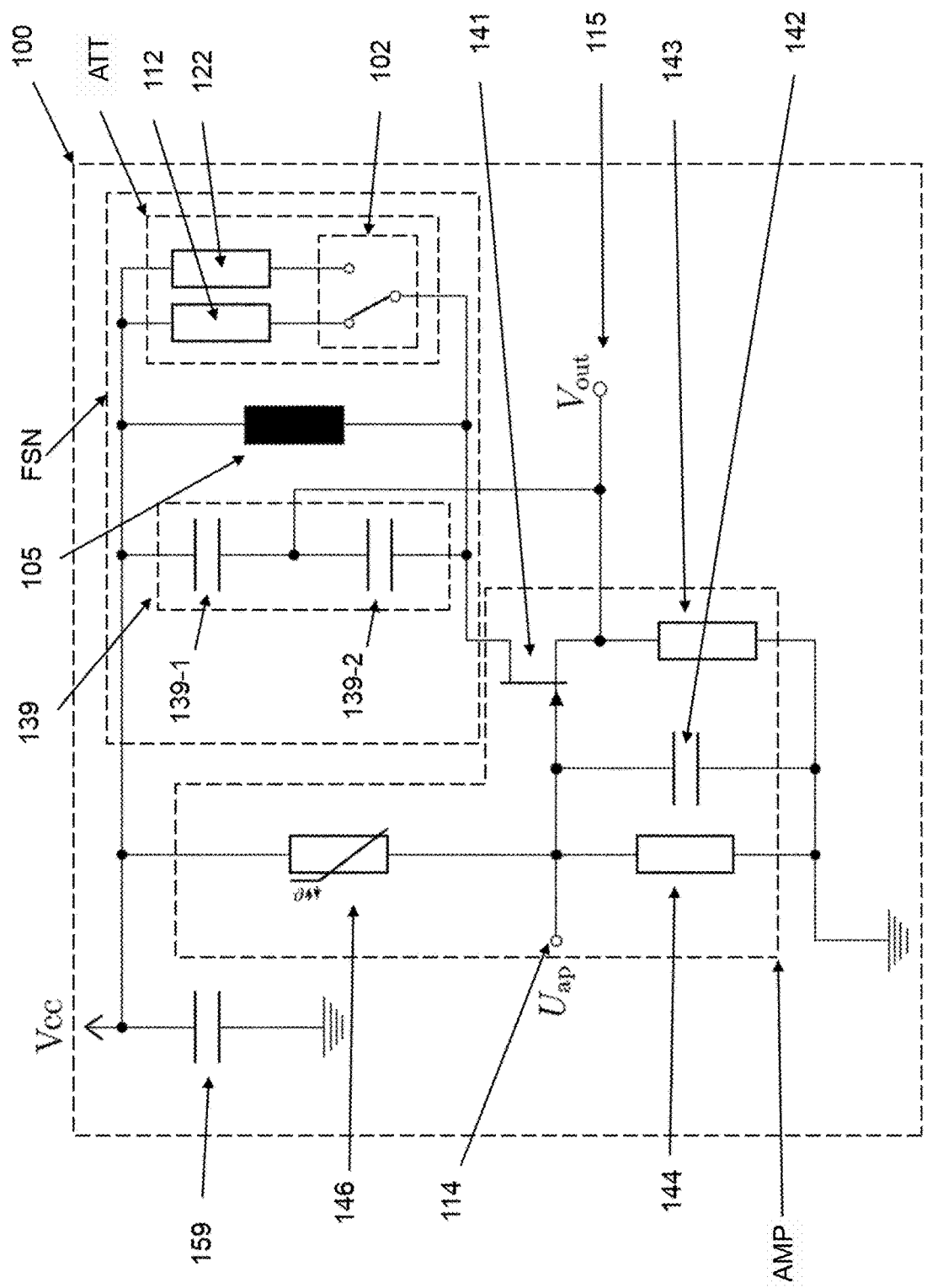
FIG. 10 shows the temperature-compensated contact monitoring device in a first embodiment.

FIG. 10 shows a more detailed circuit diagram of an embodiment example of the oscillator circuit with temperature compensation according to the invention. The same reference numerals indicate the same components as in the previous figures. The amplifier AMP is formed here by a junction field effect transistor (JFET) 141 in gate connection, the resistors 144, 146 and 143 and the capacitor 142, with the aid of which the operating point of the transistor 141 is set. The frequency-selective network FSN comprises the inductance 105, the capacitive element 139 formed by the capacitances 139-1 and 139-2, and the attenuator AMP formed by the effective resistors 112, 122 and the contact 101 to be monitored, the state of which determines the action of the one or of the other attenuator resistor 112, 122. The capacitor 159 stabilises the operating voltage. The circuit can be designed such that an oscillating signal can be observed at the output 115 for a first effective attenuation via the attenuator resistor 112, and such that this oscillating signal is not present in the case of an effective attenuation via the attenuator resistor 122.

According to the invention, the operating point of the transistor 141 is affected by a voltage divider comprising a thermistor 146 and the resistor 144 in such a way that the amplification of the transistor 141 is (almost) independent of the temperature or is negligible. A temperature-dependent resistor can be used as a thermistor. There is the so-called PTC thermistor. This is, for example, a PTC resistor (English: Positive Temperature Coefficient Resistor), the resistance value of which increases as the temperature rises. In addition, there is the so-called NTC thermistor, NTC resistor (English: Negative Temperature Coefficient Resistor), the resistance value of which decreases as the temperature rises. In addition, other components with a temperature-dependent behaviour, such as semiconductor diodes, can also be used as NTC thermistors in the reverse direction.

The operating point voltage $U_{op}$ results from the supply voltage Vcc and the temperature-dependent dividing ratio of the resistors 146 and 144. The operating point voltage $U_{ap}$ is calculated using the following formula:

$$U_{op}=V_{cc}*R144/(R146(\vartheta)+R144).$$

Here $U_{op}$ refers to the operating point voltage at point 114, Vcc to the supply voltage and $\vartheta$ to the temperature.

By implementing a suitable design of the resistors 144 and 146, the operating point voltage increases (or decreases) with the temperature just enough so that the effects of the temperature-dependent amplification compensate as well as possible with the operating point-dependent amplification. In other words, a temperature-dependent bias is applied to the gate of transistor 141 precisely so that the amplification factor V is as independent of temperature as possible. In this way, a largely temperature-independent amplification, and thus a temperature-independent oscillation threshold, can be achieved. The capacitor 142 is optional and can be used, for example, to smooth the operating point voltage. The optimal combination of the resistors 144, 146 and of the capacitor 142 can be determined by experimenting, for example.

Figure 11:
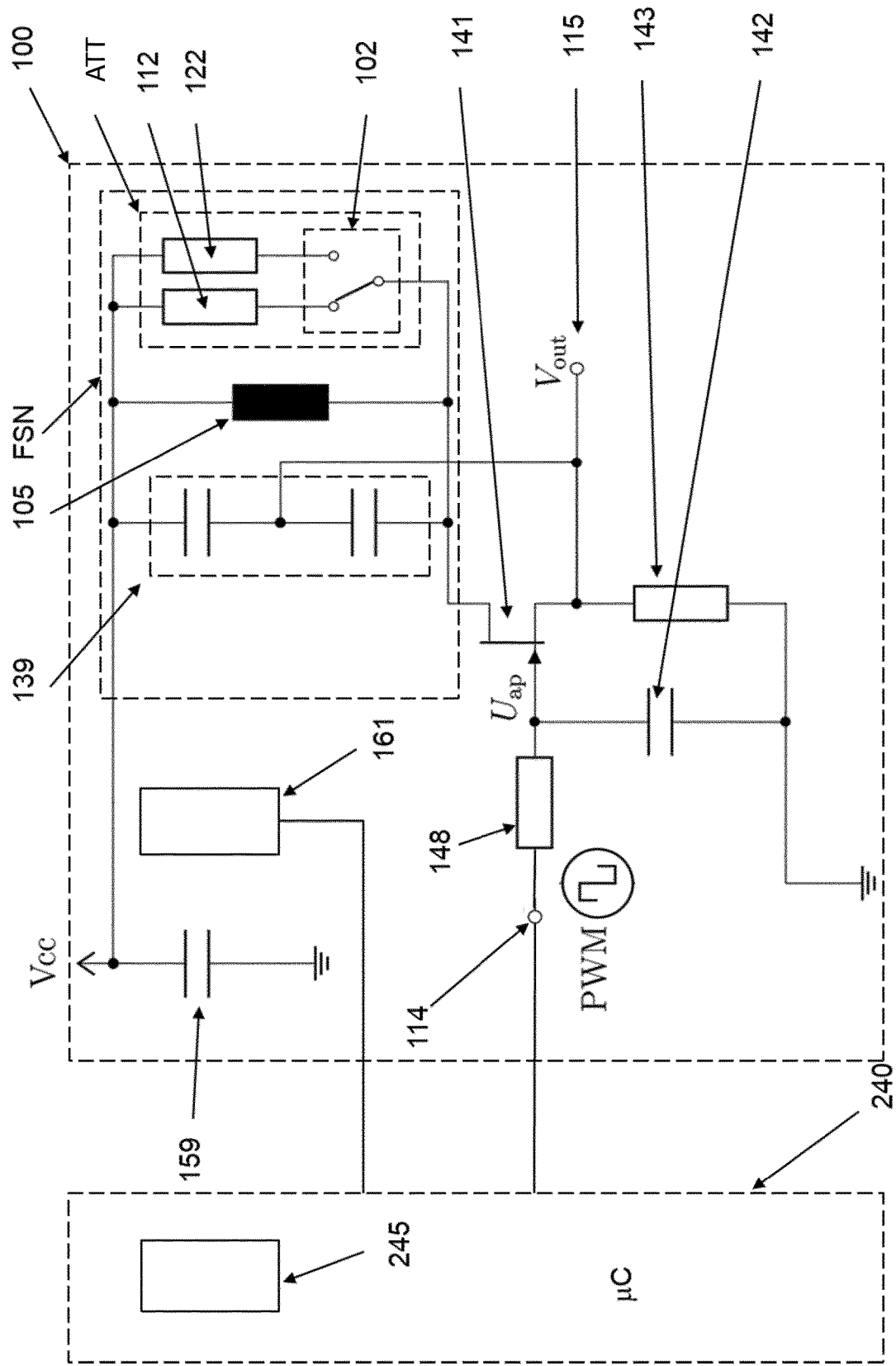
FIG. 11 shows the temperature-compensated contact monitoring device in a second embodiment.

FIG. 11 shows another type of temperature compensation. The operating point of transistor 141 is also stabilised in this variant. This solution corresponds to a digital implementation of the operating point stabilisation. The operating point voltage $U_{op}$ is generated digitally thereby and is supplied directly in temperature-compensated form. For this, it is necessary to measure the temperature $\vartheta$. A temperature sensor is therefore required. This is marked with reference numeral 161 in FIG. 11. The reference numeral 200 designates a microcontroller. The temperature sensor 161 is connected to it. A temperature operating point table 245 is stored in the microcontroller 200. The measured temperature value indicates the temperature operating point table 245. The information for an associated pulse-width modulated signal is taken from the temperature operating point table 245. The microcontroller 200 generates the assigned pulse-width modulated signal and outputs it via one of its GPIO (general purpose input/output) outputs. It is fed in at point 114 on the contact monitoring device 100. The pulse width of the signal is modulated depending on the temperature. In order to obtain the temperature-compensated operating point voltage $U_{op}$ from this, the pulse/pause-dependent average value of the signal must be found. This is done in the circuit shown in FIG. 11 with the resistor 148 and the capacitor 142, which together form a low-pass filter. The low-pass filter is connected between feed point 114 and transistor 141.

With this solution, effects other than temperature, such as ageing, component tolerances, fluctuations in the supply voltage, etc. can be compensated for as well. This solution can also be used to adjust the produced product after the manufacturing process. The component tolerances and manufacturing deviations may make product matching necessary.

Figure 12:
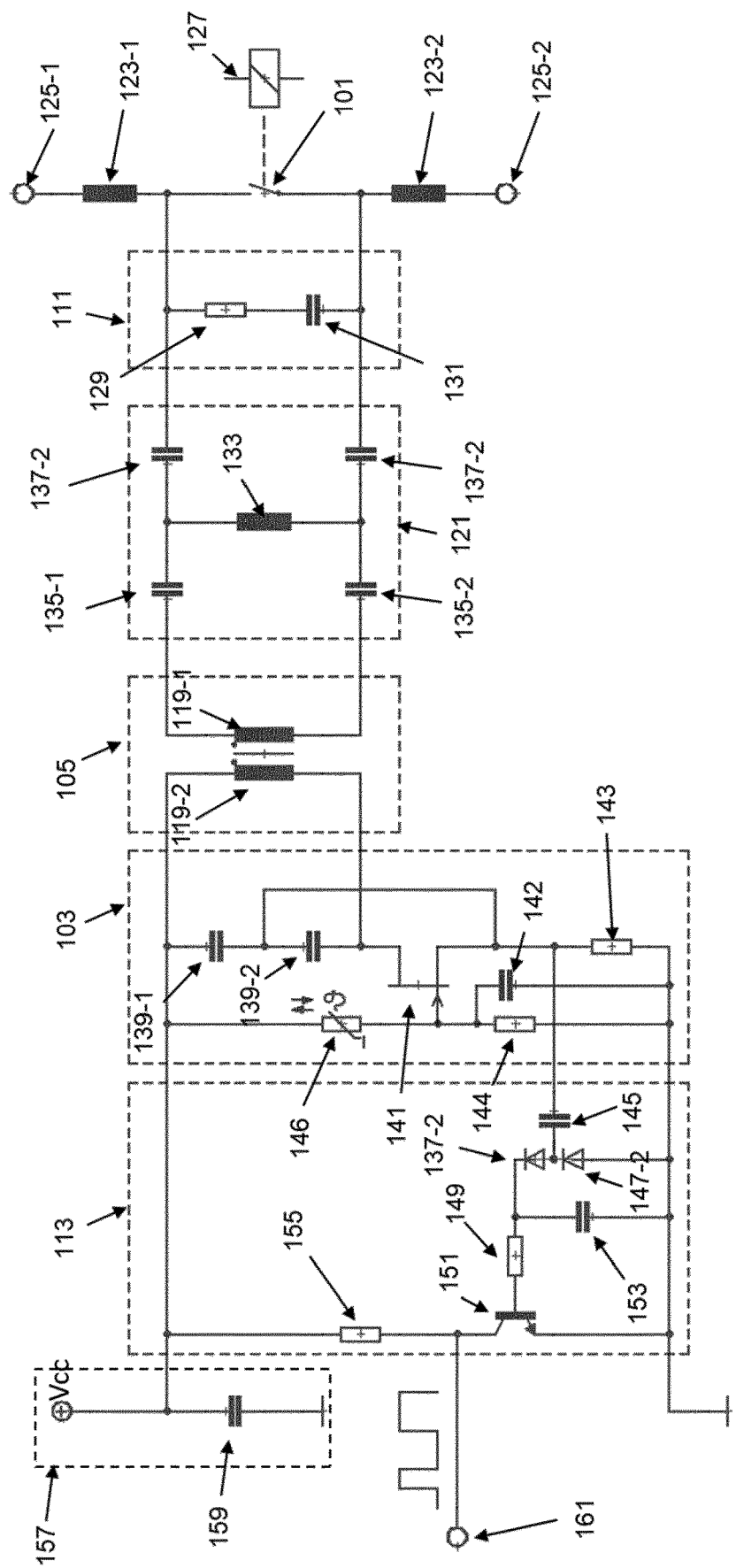
FIG. 12 shows the temperature-compensated contact monitoring device in a third embodiment.

In FIG. 12, the circuit diagram of the temperature compensation circuit is shown together with the circuit diagram shown in the exemplary embodiment of FIG. 1, in which the temperature compensation with NTC thermistor 146 is implemented. The temperature-dependent voltage divider consisting of NTC resistor 146 and resistor 144 provides the gate voltage with $U_{op}=V_{cc}*R144/(R146(\vartheta)+R144)$, which is smoothed with the help of capacitor 142. The temperature-dependent gate voltage ensures that the amplification of the transistor 141 is as temperature-independent as possible by sizing of the components appropriately.

It should be understood that the proposed method and the associated devices can be implemented in various forms of hardware, software, firmware, special processors or a combination thereof. In a preferred variant, microcontrollers with integrated RAM memory and integrated I/O interfaces are used. Special processors can include application-specific integrated circuits (ASICs), reduced instruction set computers (RISC) and/or field-programmable gate arrays (FPGAs). Preferably, the proposed method and the device is implemented as a combination of hardware and software. The software is preferably installed as an application program on a program storage device. Typically, it is a machine based on a computer platform that has hardware such as one or more central processing units (CPU), a random access memory (RAM) and one or more input/output (I/O) interface(s). An operating system is typically also installed on the computer platform. The various processes and functions described here can be part of the application program or a part that is executed via the operating system.

The disclosure is not limited to the exemplary embodiments described herein. There is room for various adaptations and modifications that the person skilled in the art would consider based on their expertise to also be part of the disclosure.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

100 Contact monitoring device
101 Electrical contact
102 Switching contact
103 Oscillator circuit
105 Coupler
107 Signal input
109 Signal output
111 Attenuator
112 First effective resistance
113 Detector
114 Feed point
115 Detector output
117 Transformer
119-1 First inductance
119-2 Second inductance
121 Impedance circuit
122 Second effective resistance
123-1 First filter element
123-2 Second filter element
125-1 First output terminal
125-2 Second output terminal
127 Switching element
129 Resistor
131 Capacitance
133 Inductance
135-1 Capacitance
135-2 Capacitance
137-1 Capacitance
137-2 Capacitance
139 Capacitive element
139-1 Capacitance
139-2 Capacitance
141 Transistor
142 Capacitor
143 Resistor
144 Resistor
145 Capacitance
146 NTC thermistor
147-1 Diode
147-2 Diode
149 Resistor
151 Transistor
153 Capacitance
155 Pull-up resistance
157 Supply voltage terminal
159 Smoothing capacitor
161 Output signal terminal
201 Switching module
203 Switching module base
205-1 Switching contact terminal
205-2 Switching contact terminal
205-3 Switching contact terminal
207-1 Plug-in contact
207-2 Plug-in contact
207-3 Plug-in contact
209 Pass-through terminal
211 Filter module
213 Rectifier
215-1 First switching control terminal
215-2 Second switching control terminal
217-1 First switching signal output
217-2 Second switching signal output
219-1 First switch connector
219-2 Second switch connector
221-1 First load terminal
221-2 Second load terminal
223 Load voltage supply
225 Electrical load
227 Line jumper
229 Separating line
240 Microcontroller
245 Temperature operating point table
301 Resistance threshold
303 First impedance curve
303a First resonance frequency point
305 Second impedance curve
305a Second resonance frequency point
401 Ferrite
611 Attenuator
601 Inductance
603 Capacitance
ATT Attenuator
FSN frequency-selective network
AMP Resonance amplifier

The invention claimed is:

1. A contact monitoring device for monitoring an electrical contact including a first contact state and a second contact state, comprising:
an oscillator circuit configured to generate an excitation signal;
a coupler including a signal input and a signal output, the oscillator circuit being connected upstream of the signal input in order to apply the excitation signal to the coupler, the coupler being configured to convert the excitation signal into a contact monitoring signal and to output the contact monitoring signal at the signal output in order to act on the electrical contact; and
a detector configured to detect a version of the excitation signal in order to monitor the electrical contact,
wherein, with the electrical contact in the first contact state, a first impedance value is set on the oscillator circuit, and, with the electrical contact in the second contact state, a second impedance value is set on the oscillator circuit,
wherein the oscillator circuit is configured to generate a resonance oscillation with the electrical contact in the first contact state and the first impedance value and to output the excitation signal,
wherein the oscillator circuit comprises a means for thermal stabilisation of the oscillator circuit,
wherein the oscillator circuit comprises a resonant circuit with a feedback branch and an amplifier,
wherein the amplifier is configured to amplify a signal fed back via the feedback branch,
wherein the amplifier has at least one transistor, an operating point of which is settable, and
wherein amplification of the at least one transistor is stabilised with the means for thermal stabilisation by adapting the operating point.

2. The contact monitoring device of claim 1, wherein the contact monitoring device is configured to either inhibit formation of the resonance oscillation and thus generation of the excitation signal, or to generate another resonance oscillation and output another excitation signal in the second contact state, and
wherein the detector is configured to detect a version of the first excitation signal and a version of the other excitation signal, or a version of the first excitation signal and an absence of the first excitation signal to detect an electrical contact state.

3. The contact monitoring device of claim 1, wherein the operating point of the transistor is settable via a voltage divider,
wherein a thermistor comprising an NTC or PTC resistor, or another NTC or PTC thermistor, comprises an element of the voltage divider as the means for thermal stabilisation.

4. The contact monitoring device of claim 1, wherein the oscillator circuit is configured to use the first impedance value to generate the excitation signal with an excitation frequency corresponding to a resonance frequency of the oscillator circuit, and
wherein the oscillator circuit is configured to change a signal amplitude of the excitation signal based on an impedance value at the signal input.

5. The contact monitoring device of claim 1, further comprising:
an attenuator connected downstream of the signal output and coupled with the electrical contact, the attenuator being configured to provide an impedance with the electrical contact in the second contact state in order to inhibit action of an impedance of the electrical contact in the second contact state,
wherein, when the attenuator is active, the signal input of the coupler is attenuated, the oscillator circuit is non-oscillatory, and output of the excitation signal is inhibited.

6. The contact monitoring device of claim 5, wherein the coupler and the oscillator circuit comprises a resonant circuit, and
wherein the attenuator is configured to attenuate the resonant circuit in the second contact state to reduce a signal amplitude of the excitation signal.

7. The contact monitoring device of claim 5, wherein the attenuator is bridged at low impedance using the electrical contact in the first contact state and an attenuation of the attenuator coupled with the signal input by the coupler is reduced, and
wherein the oscillator circuit is configured to generate the excitation signal with an increased signal amplitude with the reduced attenuation.

8. The contact monitoring device of claim 5, wherein the attenuator comprises a capacitance comprising a printed circuit board capacitor.

9. The contact monitoring device of claim 5, further comprising:
an impedance circuit connected downstream of the signal output and coupled with the attenuator,
wherein the impedance circuit is configured to compensate for a leakage inductance and/or a leakage capacitance of the coupler at a contact monitoring signal with a predetermined frequency.

10. The contact monitoring device of claim 9, wherein the impedance circuit is configured to reduce a total capacitance and/or a total inductance via galvanic isolation of the coupler.

11. The contact monitoring device of claim 1, wherein the oscillator circuit has a detector output and is configured to provide the excitation signal to the detector via the detector output.

12. The contact monitoring device of claim 1, wherein the detector is configured to convert the excitation signal into an output signal and to output the output signal in at least two different signal states, and
wherein a first signal state of at least two signal states indicates a closed electrical contact and a second signal state of at least two signal states indicates an open electrical contact.

13. The contact monitoring device of claim 12, wherein the detector is configured to output the output signal in the first signal state when an oscillating excitation signal is present at the detector output, and to output the output signal in the second signal state when a non-oscillating excitation signal is present at the detector output or a signal amplitude of the excitation signal is below an amplitude threshold.

14. The contact monitoring device of claim 1, wherein the coupler is configured to galvanically isolate the oscillator circuit and/or the detector from the electrical contact.

15. The contact monitoring device of claim 1, wherein the detector is configured to detect a switch-on signal for switching the electrical contact and a change in the excitation signal, and
wherein the detector is configured to output a binary error signal indicating whether the electrical contact is switched in accordance with the switch-on signal.

16. The contact monitoring device of claim 15, wherein the detector is configured to, upon receiving the switch-on signal, detect the excitation signal within a predetermined time interval to determine whether the electrical contact is switched in accordance with the switch-on signal within the predetermined time interval.

17. The contact monitoring device of claim 15, further comprising:
an optical display element configured to indicate detection of the switch-on signal and a corresponding detected switching of the electrical contact and a deviation from the expected switch-on signal, respectively.

18. The contact monitoring device of claim 1, wherein the coupler comprises a transformer having a first inductance and a second inductance, the first inductance being inductively coupled with the second inductance to convert the excitation signal into the contact monitoring signal.

19. The contact monitoring device of claim 1, further comprising:
a first filter element; and
a second filter element,
wherein the electrical contact includes a first output terminal downstream of which the first filter element is connected, and
wherein the electrical contact includes a second output terminal, downstream of which the second filter element is connected in order to attenuate high-frequency signals applied by the coupler to the switching contact and/or to an electrical load and/or voltage source coupled with the electrical contact.

20. The contact monitoring device of claim 19, wherein the first filter element and/or the second filter element include a resistive impedance component at the oscillator frequency configured to prevent misinterpretation of an external short circuit of the first output terminal with the second output terminal as a closing of the electrical contact.

21. A contact monitoring device for monitoring an electrical contact including a first contact state and a second contact state, comprising:
an oscillator circuit configured to generate an excitation signal;
a coupler including a signal input and a signal output, the oscillator circuit being connected upstream of the signal input in order to apply the excitation signal to the coupler, the coupler being configured to convert the excitation signal into a contact monitoring signal and to output the contact monitoring signal at the signal output in order to act on the electrical contact; and a detector configured to detect a version of the excitation signal in order to monitor the electrical contact, wherein, with the electrical contact in the first contact state, a first impedance value is set on the oscillator circuit, and, with the electrical contact in the second contact state, a second impedance value is set on the oscillator circuit, wherein the oscillator circuit is configured to generate a resonance oscillation with the electrical contact in the first contact state and the first impedance value and to output the excitation signal, wherein the oscillator circuit comprises a means for thermal stabilisation of the oscillator circuit, wherein the oscillator circuit comprises a resonant circuit with a feedback branch and an amplifier, wherein the amplifier is configured to amplify a signal fed back via the feedback branch, wherein the amplifier has at least one transistor, an operating point of which is settable, wherein amplification of the at least one transistor is stabilised with the means for thermal stabilisation by adapting the operating point, wherein the means for thermal stabilisation comprises a temperature sensor, a signal of which is evaluated by a microcontroller that generates a corresponding correction signal that sets the operating point of the at least one transistor for the thermal stabilisation, and wherein the microcontroller generates the correction signal as a PWM signal, corresponding to a pulse-width modulated signal, and an averager averages the PWM signal and supplies it to the at least one transistor.

22. The contact monitoring device of claim 21, wherein the averager comprises a low-pass filter comprising a resistor and a capacitor.

* * * * *